United States Patent
Lotfi et al.

(10) Patent No.: US 7,335,948 B2
(45) Date of Patent: Feb. 26, 2008

(54) INTEGRATED CIRCUIT INCORPORATING HIGHER VOLTAGE DEVICES AND LOW VOLTAGE DEVICES THEREIN

(75) Inventors: Ashraf W. Lotfi, Bridgewater, NJ (US); Jian Tan, Bridgewater, NJ (US)

(73) Assignee: Enpirion, Inc., Bridgewater, NJ (US)

( * ) Notice: Subject to any disclaimer, the term of this patent is extended or adjusted under 35 U.S.C. 154(b) by 0 days.

(21) Appl. No.: 10/924,088

(22) Filed: Aug. 23, 2004

(65) Prior Publication Data

US 2006/0038237 A1   Feb. 23, 2006

(51) Int. Cl.
   *H01L 29/94*   (2006.01)
(52) U.S. Cl. ............... 257/338; 257/371; 257/E21.633
(58) Field of Classification Search ............... 257/374, 257/338, 343, 336, 371, E21.633
   See application file for complete search history.

(56) References Cited

U.S. PATENT DOCUMENTS

| | | | |
|---|---|---|---|
| 4,918,026 A | 4/1990 | Kosiak et al. |
| 4,947,192 A | 8/1990 | Hawkins et al. |
| 5,014,098 A | 5/1991 | Schlais et al. |
| 5,029,283 A | 7/1991 | Ellsworth et al. |
| 5,047,358 A | 9/1991 | Kosiak et al. |
| 5,169,794 A | 12/1992 | Iranmanesh |
| 5,264,782 A | 11/1993 | Newton |
| 5,285,369 A | 2/1994 | Balakrishnan |
| 5,321,319 A | 6/1994 | Mahmood |
| 5,366,916 A | 11/1994 | Summe et al. |
| 5,469,334 A | 11/1995 | Balakrishnan |
| 5,485,027 A | 1/1996 | Williams et al. |
| 5,504,450 A | 4/1996 | McPartland |
| 5,610,421 A | 3/1997 | Contiero et al. |
| 5,644,266 A | 7/1997 | Chen et al. |
| 5,710,054 A | 1/1998 | Gardner et al. |
| 5,833,585 A | 11/1998 | Jones et al. |
| 5,859,606 A | 1/1999 | Schrader et al. |
| 5,888,861 A | 3/1999 | Chien et al. |
| 5,889,315 A | 3/1999 | Farrenkopf et al. |
| 5,982,645 A | 11/1999 | Levran et al. |
| 6,005,377 A | 12/1999 | Chen et al. |

(Continued)

OTHER PUBLICATIONS

U.S. Appl. No. 10/766,983, Dwarakanath, et al. filed Jan. 29, 2004.

(Continued)

*Primary Examiner*—Howard Weiss
*Assistant Examiner*—John C Ingham
(74) *Attorney, Agent, or Firm*—Slater & Matsil, L.L.P.

(57) ABSTRACT

An integrated circuit formed on a semiconductor substrate and configured to accommodate higher voltage devices and low voltage devices therein. In one embodiment, the integrated circuit includes a switch formed on the semiconductor substrate and a driver switch of a driver configured to provide a drive signal to the switch and embodied in a transistor. The transistor includes a gate located over a channel region recessed into a semiconductor substrate, and a source/drain including a lightly doped region located adjacent the channel region and a heavily doped region located adjacent the lightly doped region. The transistor also includes an oppositely doped well located under and within the channel region. The transistor still further includes a doped region, located between the heavily doped region and the oppositely doped well, having a doping concentration profile less than a doping concentration profile of the heavily doped region.

22 Claims, 8 Drawing Sheets

U.S. PATENT DOCUMENTS

| | | | |
|---|---|---|---|
| 6,118,351 A | 9/2000 | Kossives et al. | |
| 6,166,989 A | 12/2000 | Hamamoto et al. | |
| 6,204,542 B1 | 3/2001 | Kinoshita et al. | |
| 6,255,714 B1 | 7/2001 | Kossives et al. | |
| 6,271,063 B1 | 8/2001 | Chan et al. | |
| 6,288,424 B1 | 9/2001 | Ludikhuize | |
| 6,297,108 B1 * | 10/2001 | Chu | 438/297 |
| 6,380,004 B2 | 4/2002 | Boden, Jr. et al. | |
| 6,384,447 B2 | 5/2002 | Mihnea et al. | |
| 6,384,643 B1 | 5/2002 | Grose et al. | |
| 6,392,275 B1 | 5/2002 | Jang | |
| 6,413,806 B1 | 7/2002 | Sicard et al. | |
| 6,420,771 B2 | 7/2002 | Gregory | |
| 6,495,019 B1 | 12/2002 | Filas et al. | |
| 6,521,960 B2 | 2/2003 | Lee | |
| 6,541,819 B2 | 4/2003 | Lotfi et al. | |
| 6,545,360 B1 | 4/2003 | Ohkubo et al. | |
| 6,551,871 B2 | 4/2003 | Takamura | |
| 6,653,174 B1 | 11/2003 | Nemati et al. | |
| 6,688,985 B2 | 2/2004 | Weiss et al. | |
| 6,744,676 B2 | 6/2004 | Leung et al. | |
| 6,765,272 B2 | 7/2004 | Natsume | |
| 6,855,985 B2 | 2/2005 | Williams et al. | |
| 6,873,017 B2 | 3/2005 | Cai et al. | |
| 6,900,101 B2 | 5/2005 | Lin | |
| 6,911,694 B2 | 6/2005 | Negoro et al. | |
| 7,012,792 B2 | 3/2006 | Yoshida | |
| 7,015,544 B2 * | 3/2006 | Lotfi et al. | 257/336 |
| 7,019,505 B2 | 3/2006 | Dwarakanath et al. | |
| 7,038,438 B2 | 5/2006 | Dwarakanath et al. | |
| 7,186,606 B2 | 3/2007 | Lotfi et al. | |
| 7,195,981 B2 | 3/2007 | Lotfi et al. | |
| 7,214,985 B2 | 5/2007 | Lotfi et al. | |
| 7,229,886 B2 | 6/2007 | Lotfi et al. | |
| 7,230,302 B2 | 6/2007 | Lotfi et al. | |
| 7,232,733 B2 | 6/2007 | Lotfi et al. | |
| 2004/0094806 A1 | 5/2004 | Schillaci et al. | |
| 2005/0169024 A1 | 8/2004 | Dwarakanath et al. | |
| 2004/0227190 A1 | 11/2004 | Cai et al. | |
| 2005/0167756 A1 | 8/2005 | Lotfi et al. | |
| 2005/0168205 A1 | 8/2005 | Dwarakanath et al. | |
| 2005/0179094 A1 | 8/2005 | Robb et al. | |
| 2005/0188203 A1 | 8/2005 | Dwarakanath et al. | |
| 2006/0027864 A1 * | 2/2006 | Negoro et al. | 257/335 |
| 2006/0038238 A1 | 2/2006 | Lotfi et al. | |
| 2006/0040441 A1 | 2/2006 | Lotfi et al. | |
| 2006/0040449 A1 | 2/2006 | Lotfi et al. | |

OTHER PUBLICATIONS

U.S. Appl. No. 10/767,540, Dwarakanath, et al. filed Jan. 29, 2004.
U.S. Appl. No. 10/767,684, Lotfi, et al. filed Jan. 29, 2004.
U.S. Appl. No. 10/767,937, Dwarakanath, et al. filed Jan. 29, 2004.
Betancourt-Zamora, R.J. et al., "A 1.5 mW, 200 MHz CMOS VCO for Wireless Biotelemetry," First International Workshop on Design of Mixed-Mode Integrated Circuits and Applications, Cancun, Mexico, pp. 72-74, Jul., 1997.
Goodman, J. et al., "An Energy/Security Scalable Encryption Processor Using an Embedded Variable Voltage DC/DC Converter," IEEE Journal of Solid-State Circuits, vol. 33, No. 11 (Nov. 1998).
Horowitz, P., et al., "The Art of Electronics," Second Edition, 1989, pp. 288-291, Cambridge University Press, Cambridge, MA.
Lotfi, A.W., et al., "Issues and Advances in High-Frequency Magnetics for Switching Power Supplies," Proceedings of the IEEE, Jun. 2001, vol. 89, No. 6, pp. 833-845.

* cited by examiner

INTEGRATED CIRCUIT INCORPORATING HIGHER VOLTAGE DEVICES AND LOW VOLTAGE DEVICES THEREIN

TECHNICAL FIELD

The present invention is directed, in general, to integrated circuits and, more specifically, to an integrated circuit incorporating higher voltage devices and low voltage devices therein.

BACKGROUND

The design of early integrated circuits focused on implementing an increasing number of small semiconductor devices on a semiconductor substrate to achieve substantial improvements in manufacturing efficiency and cost, product size, and performance. The continuing improvements in the design of integrated circuits over the past few decades has been so dramatic and so pervasive in numerous products that the effects can be measured in changes in industries.

The design and construction of integrated circuits has continued to evolve in a number of different areas. One area of innovation is a continuing reduction of feature sizes of semiconductor devices such as control and signal processing devices formed on a semiconductor substrate. Another area of innovation is the advent of construction techniques to incorporate higher voltage semiconductor devices (also referred to as "higher voltage devices") having higher voltage handling capability such as switches of a power train of a power converter into the integrated circuits.

An objective of incorporating control and signal processing devices on a semiconductor substrate with the higher voltage devices often encounters conflicting design requirements. More specifically, lower voltages (e.g., 2.5 volts) are employed with the control and signal processing devices (hence, also referred to as "low voltage devices") to prevent flashover between the fine line structures thereof. A potential difference of only a few volts separated by a fraction of a micrometer can produce electric fields of sufficient magnitude to induce locally destructive ionization in the control and signal processing devices.

When employing the higher voltage devices therewith, it is often necessary to sense and switch higher external circuit voltages (e.g., ten volts or higher) on the integrated circuit. To accommodate the higher voltage devices on a semiconductor substrate with the control and signal processing devices, a large number of processing steps are performed to produce the integrated circuit. Since the cost of an integrated circuit is roughly proportional to the number of processing steps to construct the same, there has been limited progress in the introduction of low cost integrated circuits that include both control and signal processing devices and higher voltage devices such as the switches of the power train of a power converter.

The aforementioned constraints have been exacerbated by the need to employ a substantial area of the semiconductor substrate to incorporate more efficient and even higher voltage devices into an integrated circuit. Inasmuch as the cost of a die that incorporates the integrated circuit is roughly proportional to the area thereof, the presence of the higher voltage devices conflicts with the reduction in area achieved by incorporating the fine line features in the control and signal processing devices.

With respect to the type of semiconductor devices readily available, complementary metal oxide semiconductor ("CMOS") devices are commonly used in integrated circuits. The CMOS devices such P-type metal oxide semiconductor ("PMOS") devices and N-type metal oxide semiconductor ("NMOS") devices are used as logic devices, memory devices, or other devices such as the control and signal processing devices. In addition to the CMOS devices, laterally diffused metal oxide semiconductor ("LDMOS") devices such as P-type laterally diffused metal oxide semiconductor ("P-LDMOS") devices and N-type laterally diffused metal oxide semiconductor ("N-LDMOS") devices are also commonly used in integrated circuits. LDMOS devices are generally used for the higher voltage devices in the integrated circuit. In the context of CMOS technology, the higher voltage devices generally relate to devices that operate at voltages above a standard operating voltage for the selected CMOS devices (e.g., the low voltage devices). For instance, CMOS devices employing fine line structures having 0.25 micrometer line widths operate at or below about 2.5 volts. Thus, higher voltage devices generally include any devices operating above approximately 2.5 volts.

Integrating the CMOS and LDMOS devices on a semiconductor substrate has been a continuing goal in the field of microelectronics and has been the subject of many references over the years. For instance, U.S. Pat. No. 6,541,819 entitled "Semiconductor Device Having Non-Power Enhanced and Power Enhanced Metal Oxide Semiconductor Devices and a Method of Manufacture Therefor," to Lotfi, et al., issued Apr. 1, 2003, which is incorporated herein by reference, incorporates non-power enhanced metal oxide semiconductor devices (i.e., low voltage devices) with power enhanced metal oxide semiconductor devices (i.e., higher voltage devices) on a semiconductor substrate. While Lotfi, et al. provides a viable alternative to integrating low voltage devices and higher voltage devices on the semiconductor substrate, further improvements are preferable in view of the higher voltage handling capability associated with the use of higher voltage devices such as with the LDMOS devices in the power train of a power converter.

In the field of power microelectronics, the CMOS devices may be employed as the control and signal processing devices integral to the controller of a power converter. As an example, the control and signal processing devices are employed as low voltage switches and comparators that form portions of the controller of the power converter. The LDMOS devices, on the other hand, may be employed as the higher voltage devices integral to the power train of the power converter. The higher voltage devices perform the power switching functions to control the flow of power to, for instance, a microprocessor. The power switches include the main power switches, synchronous rectifiers, and other power switches germane to the power train of the power converter. The power switches can also be used for circuit protection functions such as a rapidly acting electronic version of an ordinary fuse or circuit breaker. Variations of power switches include metal oxide semiconductor field effect transistors ("MOSFETs") that exhibit low level gate-to-source voltage limits (e.g. 2.5 volts) and otherwise are capable of handing the higher voltages germane to the power train of the power converter.

To achieve the overall reduction in size, the integrated circuits as described herein should include control and signal processing devices with fine line structures having sub micron line widths (e.g., 0.25 micrometers) on a semiconductor substrate that operate with lower voltages to prevent flashover within the integrated circuit. At the same time, the integrated circuit may incorporate higher voltage devices that can conduct amperes of current and withstand voltages of, for instance, ten volts. A benefit of incorporating the low voltage devices and the higher voltage devices on the semiconductor substrate is that it is possible to accommodate higher switching frequencies in the design of the power processing circuit due to a reduction of parasitic capacitances and inductances in the integrated circuit.

While a design and implementation of low voltage devices such as logic devices that form portions of a microprocessor have been readily incorporated into integrated circuits, the systems that power the logic devices have not to date been readily incorporated into integrated circuits. There has been pressure directed to the power electronics industry to make parallel improvements in the power conversion technology and, in particular, with the power converters that regulate the power to, for instance, the microprocessors that employ a high level of integrated circuit technology in the design thereof. Thus, an evolutionary direction in the power electronics industry is to reduce the size and cost of the power converters which correspondingly induces greater levels of silicon integration in a design of the integrated circuits embodying the same.

Although power converters have shown dramatic improvements in size, cost, and efficiency over the past few decades, the design of the power converters have not kept pace with the improvements in integrated circuit technology directed to the logic devices and the like, which follow Moore's Law demonstrating a doubling of performance every 18 months as viewed by certain metrics of digital performance. As representative examples of improvements in the smaller and more compact power converters, see U.S. Pat. No. 5,469,334, entitled "Plastic Quad-packaged Switched-mode Integrated Circuit with Integrated Transformer Windings and Mouldings for Transformer Core Pieces," to Balakrishnan, issued on Nov. 21, 1995, and U.S. Pat. No. 5,285,369, entitled "Switched Mode Power Supply Integrated Circuit with Start-up Self-biasing," to Balakrishnan, issued on Feb. 8, 1994, which are incorporated herein by reference. While Balakrishnan and other references have demonstrated noticeable improvements of incorporating power converters into an integrated circuit, an industry wide integration of higher voltage level devices (again, such as the switches of the power train) into the design of integrated circuits, especially in power converters, has not yet gained industry wide adoption.

Another issue in a design of the power converters is an increase of the switching frequency (e.g., five megahertz) of the power train thereof. The energy stored in reactive circuit elements (e.g., inductors and capacitors) associated with the power converter is inversely proportional to the switching frequency, and the size of the reactive circuit elements is also correspondingly inversely proportional to the switching frequency. A power converter is generally designed to handle the highest switching frequency without significantly compromising power conversion efficiency. Otherwise, the switching frequency could be simply increased with a consequent reduction in the size and cost of the power converter. Achieving a high switching frequency is dependent on reducing the parasitic circuit elements such as stray interconnection capacitance and inductance. As mentioned above, incorporating the low voltage devices and the higher voltage devices within an integrated circuit embodying the power converter can have a significant impact in reducing the interconnection paths and consequently the stray interconnection parasitic capacitance and inductance. Additionally, reducing the inherent parasitic losses in the switches of the power converter such as energy stored in a gate of a MOSFET can also have a significant impact on the switching frequency of the power converter.

Accordingly, what is needed in the art is an integrated circuit and method of forming the same that incorporates higher voltage devices and low voltage devices on a semiconductor substrate that overcomes the deficiencies in the prior art. Additionally, there is a need in the art for a higher voltage device (e.g., a transistor such as a LDMOS device) that can accommodate higher voltages and is capable of being integrated with low voltage devices on a semiconductor substrate in an integrated circuit that may form a power converter or portions thereof.

SUMMARY OF THE INVENTION

These and other problems are generally solved or circumvented, and technical advantages are generally achieved, by advantageous embodiments of the present invention which includes an integrated circuit formed on a semiconductor substrate and configured to accommodate higher voltage devices and low voltage devices therein. In one embodiment, the integrated circuit includes a switch formed on the semiconductor substrate and a driver switch of a driver configured to provide a drive signal to the switch and embodied in a transistor. The transistor includes a gate located over a channel region recessed into a semiconductor substrate, and a source/drain including a lightly doped region located adjacent the channel region and a heavily doped region located adjacent the lightly doped region. The transistor also includes an oppositely doped well located under and within the channel region. The transistor still further includes a doped region, located between the heavily doped region and the oppositely doped well, having a doping concentration profile less than a doping concentration profile of the heavily doped region. The integrated circuit may still further include a complementary metal oxide semiconductor device formed on the semiconductor substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, an integrated circuit including a transistor [e.g., embodied in a laterally diffused metal oxide semiconductor ("LDMOS") device] and methods of forming the same. While the principles of the present invention will be described in the environment of a power converter, any application that may benefit from a transistor that can accommodate higher voltages and is integrable with a low voltage device [e.g., complementary metal oxide semiconductor ("CMOS") device] on a semiconductor substrate is well within the broad scope of the present invention.

The advantages associated with incorporating the higher voltage LDMOS devices with the low voltage CMOS devices facilitate the ongoing incorporation of integrated circuits with higher levels of integration into more products such as power converters. For the purposes of the present invention, higher voltage devices refer to devices that can accommodate higher operating voltages than the standard operating voltages for a referenced low voltage device. As an example and in the context of CMOS technology, the higher voltage devices generally relate to devices that operate at voltages above a standard operating voltage for the selected CMOS devices (e.g., the low voltage devices). For instance, CMOS devices employing fine line structures having 0.25 micrometer line widths operate at or below about 2.5 volts. Thus, higher voltage devices generally include any devices operating above approximately 2.5 volts. In yet another context, the higher voltage devices also generally include devices that may exhibit a low level gate-to-source voltage limit (e.g., 2.5 volts) and, at the same time, can handle drain-to-source voltages above the gate-to-source voltage limit thereof (e.g., ten volts).

Figure 1:
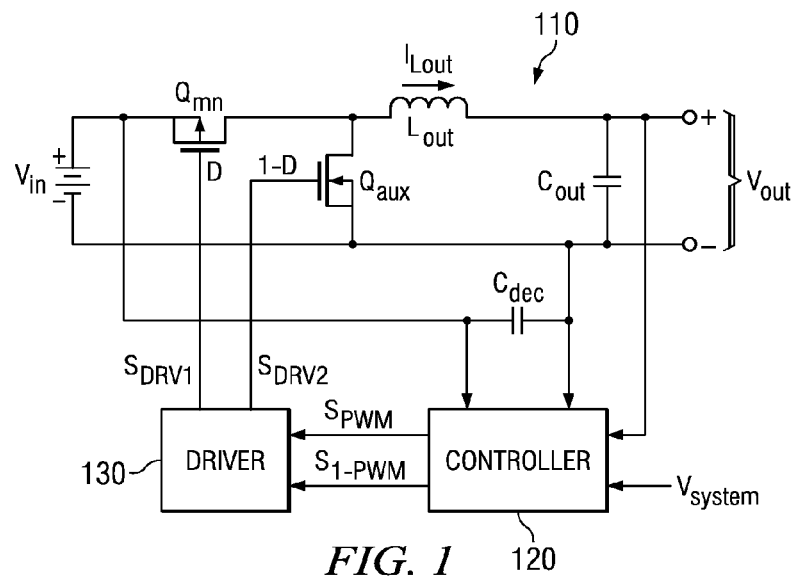
FIG. 1 illustrates a diagram of an embodiment of a power converter embodied in, or portions thereof, an integrated circuit constructed according to the principles of the present invention.

Referring initially to FIG. 1, illustrated is a diagram of an embodiment of a power converter including a semiconductor device constructed according to the principles of the present invention. The power converter includes a power train 110, a controller 120 and a driver 130, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 of the power converter receives an input voltage $V_{in}$ from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main switch $Q_{mn}$ [e.g., a P-channel metal oxide semiconductor field effect transistor ("MOSFET") embodied in a P-type laterally diffused metal oxide semiconductor ("P-LDMOS") device] is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 110. An AC component of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and an auxiliary switch $Q_{aux}$ [e.g., a N-channel MOSFET embodied in a N-type laterally diffused metal oxide semiconductor ("N-LDMOS") device] is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 120 of the power converter receives a desired characteristic such as a desired system voltage $V_{system}$ from an internal or external source associated with the microprocessor, and the output voltage $V_{out}$ of the power converter. The controller 120 is also coupled to the input voltage $V_{in}$ of the power converter and a return lead of the source of electrical power (again, represented by a battery) to provide a ground connection therefor. While only a single ground connection is illustrated in the present embodiment, those skilled in the art should understand that multiple ground connections may be employed for use within the controller 120. A decoupling capacitor $C_{dec}$ is coupled to the path from the input voltage $V_{in}$ to the controller 120. The decoupling capacitor $C_{dec}$ is configured to absorb high frequency noise signals associated with the source of electrical power to protect the controller 120.

In accordance with the aforementioned characteristics, the controller 120 provides a signal (e.g., a pulse width modulated signal $S_{PWM}$) to control a duty cycle and a frequency of the main and auxiliary switches $Q_{mn}$, $Q_{aux}$ of the power train 110 to regulate the output voltage $V_{out}$ thereof. The controller 120 may also provide a complement of the signal (e.g., a complemtary pulse width modulated signal $S_{1-PWM}$) in accordance with the aforementioned characteristics. Any controller adapted to control at least one switch of the power converter is well within the broad scope of the present invention. As an example, a controller employing digital circuitry is disclosed in U.S. Patent Application Publication No. 2005/0169024, entitled "Controller for a Power Converter and a Method of Controlling a Switch Thereof," to Dwarakanath, et at and U.S. Patent Application Publication No. 2005/0168205, entitled "Controller for a Power Converter and Method of Controlling a Switch Thereof," to Dwarakanath, et at, which are incorporated herein by reference.

The power converter also includes the driver 130 configured to provide drive signals $S_{DRV1}$, $S_{DRV2}$ to the main and auxiliary switches $Q_{mn}$, $Q_{aux}$, respectively, based on the signals $S_{PWM}$, $S_{1-PWM}$ provided by the controller 120. There are a number of viable alternatives to implement a driver 130 that include techniques to provide sufficient signal delays to prevent crosscurrents when controlling multiple switches in the power converter. The driver 130 typically includes switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 130 capable of providing the drive signals $S_{DRV1}$, $S_{DRV2}$ to control a switch is well within the broad scope of the present invention.

According to the principles of the present invention, the main and auxiliary switches $Q_{mn}$, $Q_{aux}$ are power switches that can be incorporated into a semiconductor device in an integrated circuit proximate control or signal processing devices that perform many of the control functions of the controller 120 of the power converter. As mentioned above, the control and signal processing devices are typically CMOS devices such as P-type metal oxide semiconductor ("PMOS") devices and N-type metal oxide semiconductor ("NMOS") devices. The PMOS and NMOS devices may also be referred to as P-channel and N-channel MOSFETs, respectively. Lower voltages (e.g., 2.5 volts) are employed with the control and signal processing devices (hence, also referred to as "low voltage devices") to prevent flashover between the fine line structures thereof.

The main and auxiliary switches $Q_{mn}$, $Q_{aux}$ of the power train 110, ones of the plurality of driver switches of the driver 130 and selected switches or other devices within the controller 120 are typically formed by LDMOS devices that handle higher voltages (e.g., ten volts) and hence are referred to as higher voltage devices. Integrating the control and signal processing devices, power switches and other switches (e.g., the driver switches) on a semiconductor substrate provides opportunities for substantial reductions in cost and size of an integrated circuit employable with the power converter or other apparatus employing like devices.

Additionally, when providing a drive signals $S_{DRV1}$, $S_{DRV2}$ to a switch (e.g., the main switch $Q_{mn}$) such as a P-channel MOSFET having a control voltage limit (i.e., a gate voltage limit) of 2.5 volts, and in the environment of a power converter having a nominal input voltage $V_{in}$ of five volts, the extended voltage range present on the gate terminal of the main switch $Q_{mn}$ may break down the integrity of the thin gate oxide thereof. In other words, when the input voltage $V_{in}$ to the power converter which is translated into the drive signal $S_{DRV1}$ to the main switch $Q_{mn}$ under certain conditions as described above exceeds the gate voltage limit thereof, the main switch $Q_{mn}$ may be damaged and fail. Another layer of complexity arises when the plurality of driver switches of the driver 130 are referenced to a voltage level (e.g., a ground potential) and the main switch $Q_{mn}$ to be driven is referenced to another voltage (e.g., the input voltage $V_{in}$ to the power converter). Colloquially, the main switch $Q_{mn}$ of the power converter is referred to as a "floating" switch. A driver 130 for the power converter, therefore, should be capable of handling applications wherein the main switch $Q_{mn}$ to be driven exhibits a smaller control voltage limit (e.g., gate voltage limit) from the control terminal to another terminal (e.g., the gate terminal to the source terminal) thereof and is referenced to a voltage level different from the driver 130.

Figure 2:
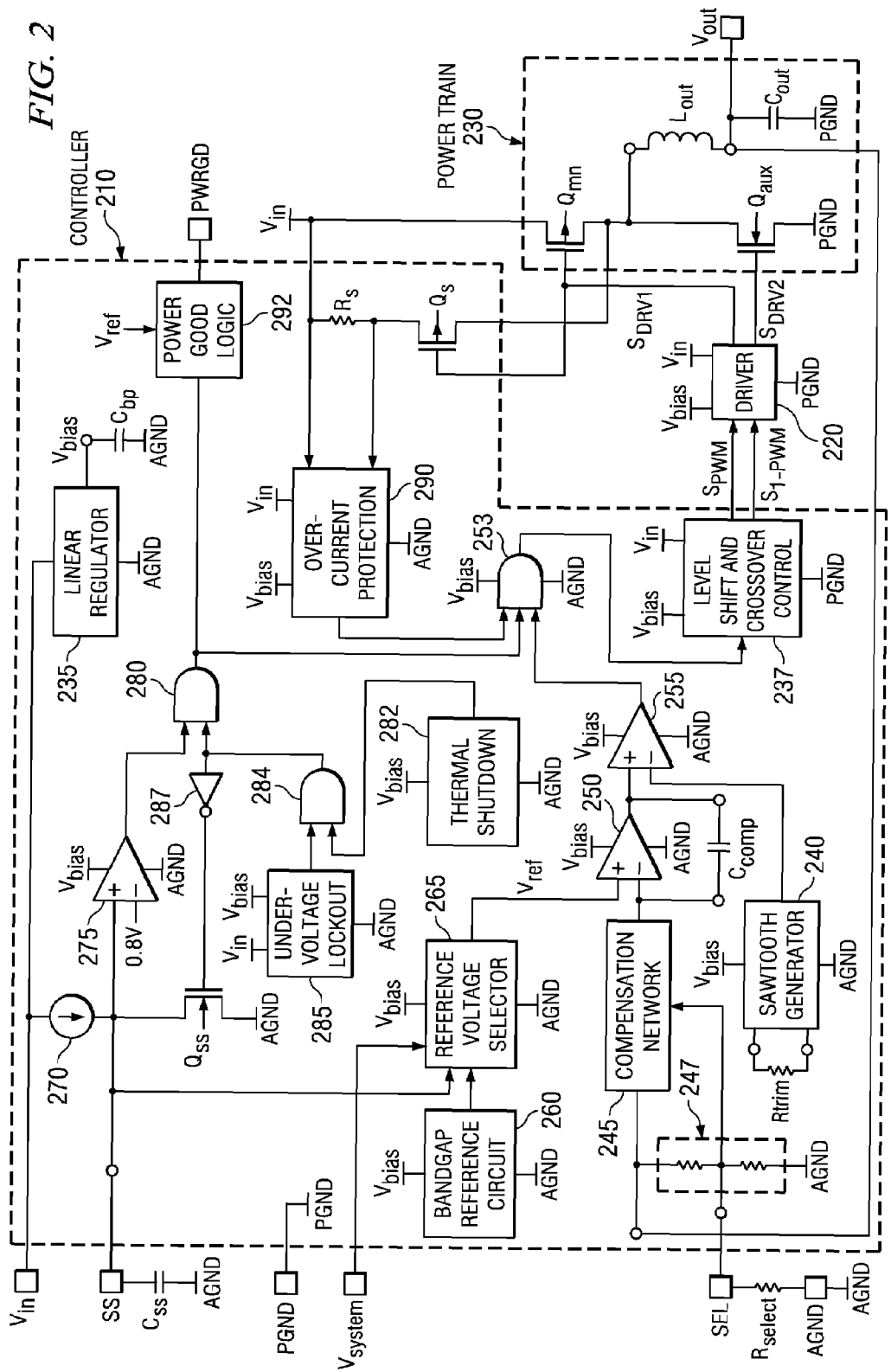
FIG. 2 illustrates a schematic diagram of an embodiment of a controller in an environment of a power converter embodied in, or portions thereof, an integrated circuit constructed according to the principles of the present invention.

Turning now FIG. 2, illustrated is a schematic diagram of an embodiment of a controller in an environment of a power converter embodied in, or portions thereof, an integrated circuit constructed according to the principles of the present invention. The power converter includes a controller 210, a driver 220 and a power train 230. The controller 210 provides a signal (e.g., a pulse width modulated signal $S_{PWM}$) to control a duty cycle and a frequency of main and auxiliary switches $Q_{mn}$, $Q_{aux}$ of the power train 230 to regulate an output characteristic (e.g., an output voltage $V_{out}$) thereof. The controller 210 may also provide a complement of the signal (e.g., a complementary pulse width modulated signal $S_{1-PWM}$) via a level shift and crossover circuit 237. The level shift and crossover control circuit 237 is also adapted to adjust a delay between the signals $S_{PWM}$, $S_{1-PWM}$ that control the duty cycle of the main and auxiliary switches $Q_{mn}$, $Q_{aux}$ to substantially prevent a cross conduction and enhance the switching transitions therebetween.

The power train 230 employs a buck converter topology, which has been described above with respect to FIG. 1. The driver (e.g., a level shifting gate driver) 220 provides gate drive signals $S_{DRV1}$, $S_{DRV2}$ for the main and auxiliary switches $Q_{mn}$, $Q_{aux}$, and also for a sense switch (also referred to as a "switch in a controller 210 of the power converter," e.g., a P-channel MOSFET, embodied in a P-LDMOS device, or also referred to as "another LDMOS device") $Q_S$. The sense switch $Q_S$ is configured to measure an output characteristic (e.g., an output current) of the power converter.

Figure 4:
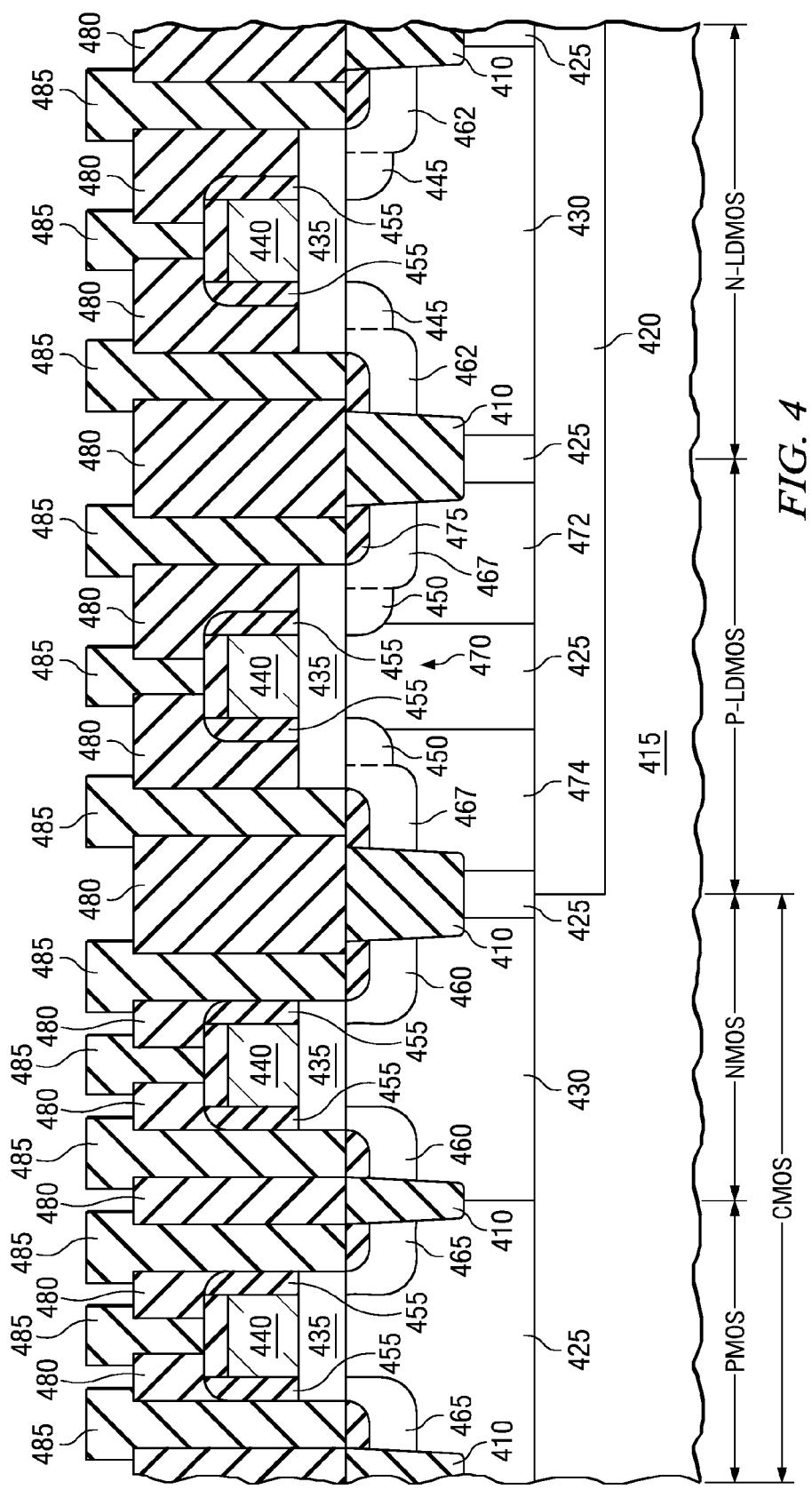
FIG. 4 illustrates a cross sectional view of an embodiment of a semiconductor device employable in an integrated circuit constructed according to the principles of the present invention.

The low voltage and higher voltage devices of the power converter may be embodied in a semiconductor device as illustrated and described with respect to FIG. 4 to form portions of a power converter embodied in an integrated circuit. Additionally, ones of the devices of the power converter such as an output inductor $L_{out}$ and output capacitor $C_{out}$ of the power train 230, and a soft-start capacitor $C_{SS}$ and a select resistor $R_{select}$ (which selects a set point for the output voltage $V_{out}$) associated with the controller 210 may be discrete devices incorporated into or with an integrated package with the semiconductor devices that embody other devices of the power converter and still remain within the broad scope of the present invention. The discrete devices are often employed with the power converter to provide application flexibility to allow for cost reductions and design options in constructing the power converter.

The controller 210 is coupled to the input voltage $V_{in}$ and the output voltage $V_{out}$ of the power converter and to first and second ground connections PGND, AGND. For a representative power converter, the input voltage $V_{in}$ is unregulated and falls within an operational range of 2.5 to 6.5 volts. The output voltage $V_{out}$ is well regulated (e.g., within a three percent tolerance) and can be adjusted between, for instance, 1.2 to 3.5 volts. The controller 210 of the power converter also receives a desired characteristic such as a desired system voltage $V_{system}$ from an internal or external source associated with, for instance, a microprocessor powered by the power converter.

A soft start operation of the power converter may be adjusted by a selection of a soft start capacitor $C_{SS}$, and the output voltage $V_{out}$ may be adjusted by the select resistor $R_{select}$. A signal indicating a normal operation of the power converter is provided via a power good connection PWRGD. The active devices of the power converter are powered from the input voltage $V_{in}$ or from an internal, regulated voltage source, configured as a linear regulator 235 coupled to the input voltage $V_{in}$. The linear regulator 235 can be implemented as a dissipative regulator as hereinafter described.

As is well understood by those skilled in the art, the first and second ground connections PGND, AGND are representative of ground connections for the higher voltage devices handling higher currents and the low voltage devices handling low currents, respectively. The first ground connection PGND is for currents flowing in the higher voltage devices that are less sensitive to system noise. The second ground connection AGND is for currents flowing in the low voltage devices that are more sensitive to system noise. The first and second ground connections PGND, AGND are typically coupled at a single point within the power converter.

As described herein and, more specifically, with respect to FIG. 4 below, the low voltage devices are generally embodied in PMOS and NMOS devices which may be integrable with the higher voltage devices embodied in P-LDMOS and N-LDMOS devices in a semiconductor device. As a result, the power converter is more readily incorporated into an integrated circuit. Additionally, bias voltages $V_{bias}$ (which may be internally or externally generated) are resident throughout the controller 210. The higher voltage devices within the power converter operate from a higher voltage source such as the input voltage $V_{in}$, and the low voltage devices operate from a low voltage source which is usually well regulated such as the bias voltages $V_{bias}$. The voltage source connections within the power converter are not intended to be exhaustive, but rather indicative of possible operational voltages for the particular devices of the power converter.

An exemplary operation of the controller 210 will hereinafter be described. A switching frequency of the power train 230 is generated by a sawtooth generator 240, which may be implemented using a current source to charge a capacitor coupled to a comparator (not shown). When the voltage of the capacitor exceeds a threshold value, the comparator enables a switch (not shown), quickly discharging the capacitor. The charge and discharge process regularly repeats, generating a sawtooth waveform for the voltage across the capacitor. To provide a consistent switching frequency, the sawtooth generator 240 is generally powered from an internal, regulated voltage source providing the bias voltage $V_{bias}$. A trim resistor $R_{trim}$ may be included to adjust the switching frequency during the design and manufacture of the controller 210. For a better understanding of sawtooth generators, see "The Art of Electronics," by Horowitz, et al., Cambridge University Press, Second Edition, pp. 288-291, 1989, the entire reference being incorporated herein by reference.

The output voltage $V_{out}$ is coupled through a compensation network 245 to a non-inverting input of an error amplifier 250 of the controller 210. Alternatively, the voltage representing the output voltage $V_{out}$ may be determined from a remote location in a distribution network and provided to the error amplifier 250. The error amplifier 250 is further compensated by a feedback network represented by a compensation capacitor $C_{comp}$. More extensive compensation networks can be provided as necessary for the error amplifier 250 as the application dictates. The compensation network 245 is coupled, via a select connection SEL, to the select resistor $R_{select}$, which is coupled to the second ground connection AGND. The select resistor $R_{select}$ provides an option to select the set point for the output voltage $V_{out}$ for the power converter.

The output of the error amplifier 250 is coupled to the non-inverting input of a comparator (e.g., a PWM comparator) 255 that compares the output of the error amplifier 250 with an output of the sawtooth generator 240. An output of the PWM comparator 255 is high during a primary interval when the main switch $Q_{mn}$ of the power train is configured to conduct. The output of the PWM comparator 255 is low during a complementary interval when the main switch $Q_{mn}$ of the power train is transitioned to a non-conducting state and the auxiliary switch $Q_{aux}$ is configured to conduct. A non-inverting input of the error amplifier 250 is coupled to a bandgap reference circuit 260 that supplies a well-regulated voltage (e.g., 1.07 volts) and a reference voltage selector 265. The reference voltage selector 265 provides a reference voltage $V_{ref}$ to the non-inverting input of the error amplifier 250 to establish a reference comparison for regulating the output voltage $V_{out}$ of the power converter.

The bandgap reference circuit 260 preferably uses bipolar CMOS technology and includes a disable pin (not shown) to disable an output therefrom. For example, when the disable pin is pulled high, the output from the bandgap reference circuit 260 can be pulled close to a ground potential with a switch (not shown), thereby disabling an operation of the power converter. The compensation network 245, as indicated above, is coupled to the select resistor $R_{select}$ to provide the set point for the output voltage $V_{out}$. The select resistor $R_{select}$ may be coupled and operative in parallel with a resistor in a voltage divider network 247 to control a fraction of the output voltage $V_{out}$ thereby further refining a set point for the output voltage $V_{out}$ for the power converter. The use of voltage dividers, in general, to alter set points is well understood in the art and will not herein be described.

A soft start operation of the power converter is controlled, in part, by a soft start capacitor $C_{SS}$. During a start up period of the power converter, the output voltage $V_{out}$ of the power converter is substantially zero, whereas during normal operation, a control loop of the controller 210 controls the conduction periods of the main and auxiliary switches $Q_{mn}$, $Q_{aux}$ to provide a regulated output voltage $V_{out}$. When the main switch $Q_{mn}$ is initially enabled to conduct and the auxiliary switch $Q_{aux}$ is non-conducting, a substantial inrush current to the power converter may occur in accordance with the input voltage $V_{in}$ to charge the output capacitor $C_{out}$. This condition may produce a substantial overshoot of the output voltage $V_{out}$ as the output inductor $L_{out}$ and output capacitor $C_{out}$ resonantly ring in response to the in-rush current.

Thus, a slowly increasing set point for the control loop during the start up period is preferable and can be achieved by increasing a voltage across the soft start capacitor $C_{SS}$ at a controlled rate. During an initial operation of the power converter (and/or during a re-start operation), the soft start capacitor $C_{SS}$ is charged by a current source 270 (via a soft start connection SS), which is coupled to the reference voltage selector 265. The reference voltage selector 265 compares a voltage across the soft start capacitor $C_{SS}$ with a voltage provided by the bandgap reference circuit 260 and the system voltage $V_{system}$ and selects the smaller value therefrom. The resulting reference voltage $V_{ref}$ from the reference voltage selector 265 is provided to the non-inverting input of the error amplifier 250 to regulate the set point for the output voltage $V_{out}$ for the power converter.

Thus, during the soft start operation and when the voltage across the soft start capacitor $C_{SS}$ is smaller than the voltage of the bandgap reference circuit 260, the voltage across the soft start capacitor $C_{SS}$ controls and slowly ramps up according to the charging rate of the soft start capacitor $C_{SS}$. When the voltage across the soft start capacitor $C_{SS}$ exceeds the voltage from the bandgap reference circuit 260, the voltage from the bandgap reference circuit 260 provides the controlling signal for the reference voltage $V_{ref}$ to the error amplifier 250. As an example, the value of the soft start capacitor $C_{SS}$ is 15 nanofarads and the current source 270 provides about 10 microamperes of current. This combination results in a rate of increase of the voltage across the soft start capacitor of about 0.67 volts/millisecond. Inasmuch as an inverting input to a soft start comparator 275 is about, for instance, 0.8 volts, a time delay of about 1.2 milliseconds is sustained before a soft start AND gate 280 enables a switching operation of the power train 230 of the power converter. Of course, the period of delay can be altered by changing the value of the soft start capacitor $C_{SS}$ or the value of the current source 270.

The linear regulator 235 provides a well regulated, low voltage bias voltage $V_{bias}$ (e.g., 2.5 volts) to supply power for the low voltage devices having voltage limitations as generally determined by fine line semiconductor structures thereof. The linear regulator 235 is powered from the input voltage $V_{in}$ and is coupled to a bypass capacitor $C_{bp}$. The bypass capacitor $C_{bp}$ can be formed from a semiconductor device as described herein or by other device techniques and structures. Additional bypass capacitors $C_{bp}$ may be employed within the controller 210 and power converter, in general, to absorb system noise therein.

The linear regulator 235 preferably includes a higher voltage device implemented with an N-LDMOS device acting as a series-pass, regulating switch (not shown). An operational amplifier (not shown) is included in the linear regulator 235 that senses the bias voltage $V_{bias}$ and a reference voltage such as provided by the bandgap reference circuit 260 to provide negative feedback to a control terminal of the series-pass, regulating switch, thereby providing voltage regulation for the bias voltage $V_{bias}$. The design of dissipative linear regulators 235 with a feedback control are well known in the art and will not herein be described. For a better understanding of the design of dissipative linear regulators, see chapter six of Horowitz, et al.

A number of circuits such as protection circuits within the controller 210 disable an operation of the power converter during unusual or undesirable operating conditions. The output of the circuits are combined via AND logic gates with an output from the PWM comparator 255 to disable the operation of the power converter when necessary. A thermal shutdown circuit 282 monitors a temperature of the power converter (e.g., a temperature of the switch embodied in a semiconductor device located on a semiconductor substrate) to protect, for example, against a possible low impedance circuit coupled inadvertently across an output of the power train 230. The temperature monitoring function can be provided using a voltage reference (not shown) which is dependent, preferably linearly, on the temperature of the monitored portion of the power converter. An output of the voltage reference is compared, for instance, with the output of the bandgap reference circuit 260 using a comparator (not shown) and, when there is a sufficient voltage difference therebetween, the comparator switches and provides a signal to a protection circuit AND gate 284.

The protection circuit AND gate 284 is also coupled to an under voltage lockout circuit 285 that compares the input voltage $V_{in}$ to a limiting threshold voltage and, when the input voltage $V_{in}$ is less than the threshold voltage, another signal is provided to the protection circuit AND gate 284. Thus, the output of the protection circuit AND gate 284 provides an indication of either a high temperature condition or an unacceptably low input voltage $V_{in}$ and disables the operation of the power converter accordingly. For further protection during a fault condition, when the main switch $Q_{mn}$ is transitioned to a non-conducting state, the auxiliary switch $Q_{aux}$ is enabled to conduct by the action of the level shifting gate driver 220, thereby discharging the output capacitor $C_{out}$ and providing further protection for the output voltage $V_{out}$ of the power converter. As an example, the under voltage lockout circuit 285 disables the operation of the power converter when the input voltage $V_{in}$ is less than 2.5 volts. When the input voltage $V_{in}$ is less than about 2.6 volts, the linear regulator 235 saturates "full on" and may lose its regulation capability, causing a drop in the bias voltage $V_{bias}$. A sufficient voltage compliance, however, can be designed into the various devices in the power converter to enable proper operation when the bias voltage $V_{bias}$ is slightly less than the desired regulated value.

An output of the protection circuit AND gate 284 is also coupled to a soft start switch $Q_{SS}$ through an inverter 287. The purpose of the soft start switch $Q_{SS}$ is to discharge the soft start capacitor $Q_{SS}$ whenever a temperature within the power converter exceeds a limit or the input voltage $V_{in}$ is below a safe operating point for the power train 230. Discharging the soft start capacitor $C_{SS}$ essentially sets the set point for the output voltage $V_{out}$ for the power train 230 to zero. The soft start capacitor $C_{SS}$ may also be discharged by a circuit external to the power converter, such as by an external switch, to disable an operation of the power converter based on external system requirements.

The protection circuit AND gate 284 provides an input to the soft start AND gate 280, which is also coupled to the soft start comparator 275. The soft start AND gate 280 monitors an output of the soft start comparator 275, which is coupled to the soft start capacitor $C_{SS}$. The soft start AND gate 280 is coupled to a PWM AND gate 253 and configured to disable the power train 230 whenever a voltage across the soft start capacitor $C_{SS}$ is less than a threshold value. In the present embodiment, the threshold value, coupled to inverting input of the soft start comparator 275, is preferably about 0.8 volts. The threshold value may be derived from the bandgap reference circuit 260. Thus, a soft start circuit of the controller 210 includes, among other things, the soft start capacitor $C_{SS}$, the soft start switch $Q_{SS}$ and the soft start comparator 275.

The controller 210 also includes other protective circuits such as an over current protection circuit 290. A sense switch Qs is coupled in parallel with the main switch $Q_{mn}$ of the power train 230 and is controlled to conduct synchronously with the main switch $Q_{mn}$. A sense resistor $R_S$ is coupled in series with the sense switch $Q_S$. Thus, a current that flows through the sense resistor $R_S$ is a fraction of the current flowing through the main switch $Q_{mn}$ when the main switch $Q_{mn}$ conducts. A voltage proportional to the sensed current is amplified by an operational amplifier (not shown) in the over current protection circuit 290 and compared to a threshold value. If the threshold value of the current through the sense resistor $R_S$ is exceeded, a disable signal is provided to the PWM AND gate 253. Thus, the over current protection circuit 290 can disable the operation of the power train 230 whenever current through the main switch $Q_{mn}$, which also generally flows through the output inductor $L_{out}$, exceeds a threshold value.

A power good monitoring circuit 292 is coupled to the output of the soft start AND gate 280, and preferably provides a signal to the power good connection PWRGD of the power converter to provide an external indication that the power converter is operating normally. In addition, the power good monitoring circuit 292 is also coupled to the reference voltage $V_{ref}$ from the reference voltage selector 265. When the output of the reference voltage selector 265 is above a predetermined reference voltage level and the output of the soft start AND gate 280 is high, the output of the power good monitoring circuit 292 is high to indicate a normal operation of the power converter. It should be understood that circuits that monitor internal voltages and the outputs of logic gates are generally well known in the art. It should further be understood that circuits that monitor the operation of a power converter can be optionally coupled to various operating points within the controller 210 and the power train 230 of the power converter.

Thus, a power converter embodied in, or portions thereof, an integrated circuit has been illustrated and described with respect to FIG. 2. As described above, the devices of the power converter may be constructed with low voltage devices and higher voltage devices integrable in a semiconductor device using fine line processing. Thus, for reasons as stated below, not only can control and signal processing devices, but higher voltage devices such as the switches of the driver and power train, can be integrated into a semiconductor device thereby further facilitating the power converter incorporated into an integrated circuit.

Figure 3:
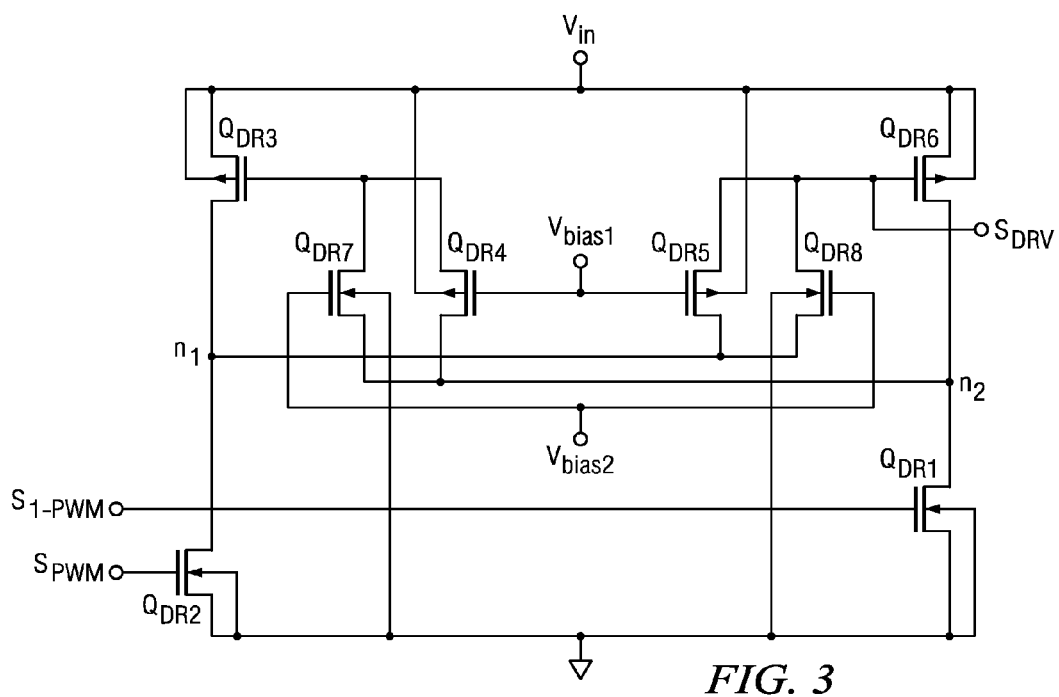
FIG. 3 illustrates a schematic diagram of an embodiment of a driver of a power converter embodied in, or portions thereof, an integrated circuit constructed according to the principles of the present invention.

Turning now to FIG. 3, illustrated is a schematic diagram of an embodiment of a driver of a power converter embodied in, or portions thereof, an integrated circuit constructed according to the principles of the present invention. The driver is adapted to provide a drive signal $S_{DRV}$ to control a switch having a control voltage limit. More specifically and in the illustrated embodiment, the driver is a gate driver that provides a gate drive signal $S_{DRV}$ to, for instance, a P-channel MOSFET that exhibits a gate voltage limit (i.e., a gate-to-source voltage limit) of 2.5 volts. The gate driver receives a signal (e.g., a pulse width modulated signal $S_{PWM}$) from a controller (see, for instance, the controller 120 illustrated and described with respect to FIG. 1) and a complement of the signal (e.g., a complementary pulse width modulated signal $S_{1-PWM}$) from the controller. Additionally, the gate driver may provide a first gate drive signal and a second gate drive signal to drive multiple switches such as the main and auxiliary switches $Q_{mn}$, $Q_{aux}$ of a power converter as described above. For purposes of the following discussion, however, the driver will be described and is adapted to provide a gate drive signal $S_{DRV}$.

The gate driver includes switching circuitry formed by a plurality of driver switches such as first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ coupled to a source of electrical power for the power converter and the controller of the power converter. The gate driver is also coupled to a first bias voltage source that provides a first bias voltage $V_{bias1}$, which may be internally or externally generated and may depend on an input voltage $V_{in}$ of the power converter. For purposes of the discussion herein, it is assumed that the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ have a low gate voltage limit and a higher voltage drain. Thus, the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ may exhibit a low gate voltage limit (e.g. 2.5 volts) and at the same time handle drain-to-source voltages above the gate voltage limit thereof (e.g., ten volts).

To simplify the discussion, it is also assumed that the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ exhibit a gate threshold voltage of about is 0.5 volts, which is consistent with a number of fine feature size, low voltage MOSFET designs. The gate threshold voltage provides a voltage level above or below which (depending on the type) the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ are enabled to conduct.

In the illustrated embodiment, the first, second, seventh and eighth driver switches $Q_{DR1}$, $Q_{DR2}$, $Q_{DR7}$, $Q_{DR8}$ are N-channel MOSFETs and the third, fourth, fifth and sixth driver switches $Q_{DR3}$, $Q_{DR4}$, $Q_{DR5}$, $Q_{DR6}$ are P-channel MOSFETs. The drain terminals of the second, third and fifth driver switches $Q_{DR2}$, $Q_{DR3}$, $Q_{DR5}$ are coupled together at a first node $n_1$. The drain terminals of the first, fourth and sixth driver switches $Q_{DR1}$, $Q_{DR4}$, $Q_{DR6}$ are coupled together at a second node $n_2$. While each of the first, second, seventh and eighth driver switches $Q_{DR1}$, $Q_{DR2}$, $Q_{DR7}$, $Q_{DR8}$ are illustrated with gate, source and drain terminals, it is also common for each of the first, second, seventh and eighth driver switches $Q_{DR1}$, $Q_{DR2}$, $Q_{DR7}$, $Q_{DR8}$ to include a body terminal.

The gate driver is coupled between an input voltage $V_{in}$ (e.g., an unregulated input voltage at a nominal five volts) of the power converter and ground, with a potential difference therebetween for the purposes of this discussion of five volts. The source terminal of the third and sixth driver switches $Q_{DR3}$, $Q_{DR6}$ are coupled to the input voltage $V_{in}$. The first bias voltage $V_{bias1}$, assumed for this discussion to be 2.5 volts with respect to the ground, is coupled to the gate terminal of the fourth and fifth driver switches $Q_{DR4}$, $Q_{DR5}$, and a return connection of the first bias voltage source is coupled to the ground. The first bias voltage source may or may not be derived from the source of electrical power that provides the input voltage $V_{in}$, depending on the application for the gate driver.

As illustrated, the seventh and eighth driver switches $Q_{DR7}$, $Q_{DR8}$ are parallel coupled to the fourth and fifth driver switches $Q_{DR4}$, $Q_{DR5}$, respectively. The seventh and eighth driver switches $Q_{DR7}$, $Q_{DR8}$ include a higher voltage source and a higher voltage drain and typically exhibit a higher source-to-gate voltage handling capability (e.g., five volts) when the source is more positive than the gate and at the same time handle drain-to-source voltages above the low gate voltage limit thereof. The gate terminal of the seventh and eighth driver switches $Q_{DR7}$, $Q_{DR8}$ are coupled together and to a second voltage bias source that provides a second bias voltage $V_{bias2}$, which may be internally or externally generated and may depend on an input voltage $V_{in}$ of the power converter.

The gate driver, in the illustrated embodiment, can operate in a couple of different modes of operation. For instance, when the input voltage $V_{in}$ to the power converter is greater than an upper gate voltage limit for a main switch $Q_{mn}$ such as a P-channel MOSFET (see, as an example, the power train of the power converter illustrated and described with respect to FIG. 1) driven by the gate driver, then voltage protective features of the gate driver are enabled.

More specifically, when the pulse width modulated signal $S_{PWM}$ provided to the second driver switch $Q_{DR2}$ is high (i.e., when the pulse width modulated signal $S_{PWM}$ is more positive than the gate threshold voltage of 0.5 volts), the first node $n_1$ that couples the drain terminals of the second and third driver switches $Q_{DR2}$, $Q_{DR3}$ is pulled low by the second driver switch $Q_{DR2}$. The drain terminal of the fifth driver switch $Q_{DR5}$ is also coupled to the first node $n_1$ and the gate terminal thereof is coupled to the first bias voltage source. Thus, the source of the fifth driver switch $Q_{DR5}$ is pulled down to three volts (i.e., one gate threshold voltage value more positive than the first bias voltage $V_{bias1}$). The gate drive signal $S_{DRV}$ is therefore pulled down two volts below the input voltage $V_{in}$, which is a sufficient voltage to enable a switch such as the main switch $Q_{mn}$, a P-channel MOSFET, illustrated and described with respect to the power train of the power converter of FIG. 1 to conduct.

When the complementary pulse width modulated signal $S_{1-PWM}$ provided to the first driver switch $Q_{DR1}$ is more positive than the gate threshold voltage, the first driver switch $Q_{DR1}$ is enabled to conduct and the second node $n_2$ is pulled down to substantially the ground voltage by an on-resistance of the first driver switch $Q_{DR1}$. The gate of the third driver switch $Q_{DR3}$ is pulled down to about three volts (i.e., one gate threshold voltage value more positive than the first bias voltage $V_{bias1}$). Thus, the third driver switch $Q_{DR3}$ is enabled to conduct and the drain thereof, coupled to first node $n_1$, is pulled up substantially to the input voltage $V_{in}$. The fifth driver switch $Q_{DR5}$ is now enabled to conduct because the gate voltage is more than one gate threshold voltage more negative than the drain thereof, and the source of the fifth driver switch $Q_{DR5}$ is pulled up substantially to the input voltage $V_{in}$. Therefore, the gate drive signal $S_{DRV}$ from the gate driver is also pulled up to substantially the input voltage $V_{in}$, which is a sufficient voltage to transition a switch such as the main switch $Q_{mn}$, a P-channel MOSFET, illustrated and described with respect to the power train of the power converter of FIG. 1 to a non-conducting state.

Accordingly, a type of level shifting gate driver has been introduced with an improved level-shifting capability that can controllably raise the gate voltage of an exemplary switch (e.g., a P-channel MOSFET) to substantially the input voltage $V_{in}$ to transition the switch to a non-conducting state, and controllably reduce the gate voltage to a lower voltage to enable the switch to conduct. Inasmuch as the gate terminal of the fifth driver switch $Q_{DR5}$ is coupled to the first bias voltage source, the fifth driver switch $Q_{DR5}$ is transitioned to a non-conducting state when a voltage present on its source is less than the first bias voltage $V_{bias1}$ plus its gate threshold voltage (treating the gate threshold voltage of a P-channel MOSFET as a positive number). If the gate driver properly applies the first bias voltage $V_{bias1}$ (e.g., if the first bias voltage $V_{bias1}$ is the input voltage $V_{in}$ minus 2.5 volts and adjusted for the gate threshold voltage of the fifth driver switch $Q_{DR5}$), the gate drive signal $S_{DRV}$ will not decrease more than 2.5 volts below input voltage $V_{in}$ thereby not exceeding the gate voltage limit of the switch to be driven. The first bias voltage $V_{bias1}$, therefore, is preferably dependent on the input voltage $V_{in}$. The gate terminal of the switch (again, a P-channel MOSFET) coupled to the gate driver will thus be protected by the gate driver and, in particular, by the fifth driver switch $Q_{DR5}$, which operatively provides a protective voltage limiting function. Finally, the gate driver is symmetrical and as the pulse width modulated signal $S_{PWM}$ and complementary pulse width modulated signal $S_{1-PWM}$ alternate, the conduction states and voltages within the gate driver alternate accordingly.

Additionally, in this mode of operation, the second bias voltage $V_{bias2}$ provided to the gate terminals of the seventh and eighth driver switches $Q_{DR7}$, $Q_{DR8}$ is at a ground potential. Since the source terminals of the seventh and eighth driver switches $Q_{DR7}$, $Q_{DR8}$ are not coupled to a potential at or below the ground potential, the seventh and eighth driver switches $Q_{DR7}$, $Q_{DR8}$ are not enabled to conduct as a consequence of the grounded gate terminals thereof. Thus, under the aforementioned circumstances, the seventh and eighth driver switches $Q_{DR7}$, $Q_{DR8}$ have little effect on the operation of the gate driver.

In another operating mode for the gate driver (enabled by the seventh and eighth driver switches $Q_{DR7}$, $Q_{DR8}$), the input voltage $V_{in}$ to the power converter is not greater than an upper gate voltage limit for a main switch $Q_{mn}$ such as a P-channel MOSFET (see, as an example, the power train of the power converter illustrated and described with respect to FIG. 1) driven by the gaze driver, then voltage protective features of the gate driver are not necessary. In this mode of operation, the clamping operation of the fifth driver switch $Q_{DR5}$ on the gate drive signal $S_{DRV}$ is inoperative. More specifically, the gate terminals of the seventh and eighth driver switches $Q_{DR7}$, $Q_{DR8}$ are coupled to a suitably high potential such as the input voltage $V_{in}$. As a result, the seventh and eighth driver switches $Q_{DR7}$, $Q_{DR8}$ are enabled to conduct. Thus, the gate drive signal $S_{DRV}$ is coupled to ground potential by an on resistance of the second and eight driver switches $Q_{DR2}$, $QDR_8$ when the main switch $Q_{mn}$, a P-channel MOSFET as discussed above, driven by the gate driver is enabled to conduct. The gate driver, therefore, selectively provides additional flexibility by altering a voltage applied to an input thereof, consequently accommodating an input voltage $V_{in}$ above or below a gate voltage limit of a switch driven therefrom. Additionally, for a more detailed analysis of this embodiment of the driver, see U.S. Patent Application Publication No. 2005/0168203, entitled "Driver for a Power Converter and Method of Driving a Switch Thereof," to Dwarakanath, et at, which is incorporated herein by reference.

Turning now to FIG. 4, illustrated is a cross sectional view of an embodiment of a semiconductor device employable in an integrated circuit constructed according to the principles of the present invention. A semiconductor substrate (also referred to as a "substrate") 415 of the semiconductor device is divided into four dielectrically separated areas to accommodate, in the illustrated embodiment, four transistors (e.g., MOSFETs) located thereon. More specifically, the substrate 415 can accommodate a PMOS device and a NMOS device that operate as low voltage devices within, for instance, a controller of a power converter (i.e., the control and signal processing devices). Additionally, the substrate 415 can accommodate a P-LDMOS device and a N-LDMOS device that operate as higher voltage devices within, for instance, a power train and driver of a power converter (i.e., the power switches and driver switches).

The semiconductor device also includes shallow trench isolation regions 410 formed within the substrate 415 to provide dielectric separation between the devices implemented on the substrate 415. The shallow trench isolation regions 410 are formed by masking the substrate 415 and using a photoresist to define the respective regions therein. The shallow trench isolation regions 410 are then etched and backfilled with a dielectric such as silicon dioxide, silicon nitride, a combination thereof, or any other suitable dielectric material. Then, the substrate 415 and the shallow trench isolation regions 410 are planarized by a lapping process.

A buried layer (e.g., a N-type buried layer) 420 is recessed within the substrate 415 in the area that accommodates the P-LDMOS device and the N-LDMOS device. The N-type buried layer 420 is formed by a deep ion implantation process (e.g., at a controlled voltage of about 200 kiloelectronvolts) of an appropriate dopant specie such as arsenic or phosphorus and results in a doping concentration profile, preferably in a range of $1 \times 10^{18}$ to $1 \times 10^{20}$ atoms/cm$^3$. The N-type buried layer 420 is preferably located approximately one micrometer below a top surface of the substrate 415, and is annealed (e.g., at 600 to 1200 degrees Celsius) as necessary to provide the proper distribution of the implanted ion specie.

The semiconductor device also includes wells (e.g., N-type wells) 425 formed in the substrate 415 in the areas that accommodate the PMOS device and the P-LDMOS device, and under the shallow trench isolation regions 410 above the N-type buried layer 420 (for the P-LDMOS device). The N-type wells 425 are formed to provide electrical isolation for the PMOS device and the P-LDMOS device and operate cooperatively with the N-type buried layer 420 (in the case of the P-LDMOS device) and the shallow trench isolation regions 410 to provide the isolation. As illustrated, the N-type well 425 above the N-type buried layer 420 does not cover the entire area that accommodates the P-LDMOS device in the substrate 415 between the shallow trench isolation regions 410 thereof. A photoresist mask defines the lateral areas for ion implantation process to form the N-type wells 425. After the ion implantation process, the implanted specie is diffused by annealing the substrate 415 at elevated temperature. An appropriate dopant specie such as arsenic or phosphorus can be used to form the N-type wells 425, preferably, but without limitation, in a retrograde doping concentration profile with approximately $1 \times 10^{17}$ atoms/cm$^3$ in the middle, and a higher doping concentration profile at the surface as well as at the bottom. The advantages of forming the N-type well 425 in the substrate 415 within a portion of the area that accommodates the P-LDMOS device will become more apparent for the reasons as set forth below.

The semiconductor device includes additional wells (e.g., P-type wells) 430 formed in the substrate 415 between the shallow trench isolation regions 410 substantially in the areas that accommodate the NMOS device and N-LDMOS device. While the P-type well 430 above the N-type buried layer 420 covers the entire area that accommodates the N-LDMOS device in the substrate 415 between the shallow trench isolation regions 410 thereof, it is well within the broad scope of the present invention to define the P-type well 430 to cover a portion of the area that accommodates the N-LDMOS device in the substrate 415.

A photoresist mask defines the lateral areas for the ion implantation process to form the P-type wells 430. After the ion implantation process, the implanted specie is diffused by an annealing the substrate 415 at an elevated temperature. An appropriate dopant specie such as boron can be used to form the P-type wells 430, preferably resulting in a retrograde doping concentration profile with approximately $1 \times 10^{17}$ atoms/cm$^3$ in the middle, and a higher doping concentration profile at the top surface as well as at the bottom. Analogous to the N-type wells 425, a width of the P-type wells 430 may vary depending on the particular devices and application and, as those skilled in the art know, may be laterally defined by the photoresist mask. For instance, while the P-type well 430 above the N-type buried layer 420 covers the entire area that accommodates the N-LDMOS device in the substrate 415 between the shallow trench isolation regions 410 thereof, it is well within the broad scope of the present invention to define the P-type well 430 to cover a portion of the area that accommodates the N-LDMOS device in the substrate 415.

The semiconductor device also includes gates 440 for the PMOS, NMOS, P-LDMOS and N-LDMOS devices located over a gate dielectric layer 435 and including gate sidewall spacers 455 about the gates 440 thereof. The dielectric material for the gate dielectric layer 435 is typically silicon dioxide with a thickness of about five nanometers for devices employing about 0.25 micrometer feature sizes and operating at low gate voltages (e.g., 2.5 volts). Assuming the gate-to-source voltage limit of the P-LDMOS and N-LDMOS devices is limited to a lower voltage (e.g., 2.5 volts) and the PMOS and NMOS devices operate at the same voltage, then the gate dielectric layer 435 can be formed with dimensions as set forth above. Preferably, the gate dielectric layer 435 is constructed with a uniform thickness to provide a gate-to-source voltage rating for the devices of approximately 2.5 volts that completely or nearly completely saturates the forward conduction properties of the device. Of course, the aforementioned voltage range for the devices is provided for illustrative purposes only and other voltage ranges are within the broad scope of the present invention.

A polysilicon layer is deposited over a surface of the gate dielectric layer 435 and doped N-type or P-type, using an appropriate doping specie. The polysilicon layer is annealed at an elevated temperature to properly diffuse the dopant. A photoresist mask is employed with an etch to define the lateral dimensions to define the gates 440. The thickness of the gates 440 may range from about 100 to about 500 nanometers, but may be even smaller or larger depending on the application. The gate sidewall spacers 455, which may be formed from an oxide or other dielectric material, are generally formed by depositing a nitride followed by an etching process.

The N-LDMOS device includes lightly doped regions (e.g., N-type lightly doped regions) 445 for the source and the drain thereof. The P-LDMOS device also includes lightly doped regions (e.g., P-type lightly doped regions) 450 for the source and the drain thereof. In the present embodiment, the N-type and P-type lightly doped regions 445, 450 provide higher voltage sources and drains for the N-LDMOS and P-LDMOS devices, respectively. As a result, not only can the N-LDMOS and P-LDMOS devices handle higher voltages from the drain-to-source thereof, but the devices can handle a higher voltage from a source-to-gate thereof when the source is more positive than the gate 440. It is recognized that the width of the N-type and P-type lightly doped regions 445, 450 may be individually varied to alter the breakdown voltage characteristics of the respective N-LDMOS and P-LDMOS devices without departing from the scope of the present invention.

The N-type and P-type lightly doped drain regions 445, 450 may be formed employing an ion implantation process in connection with a photoresist mask to define the lateral dimensions thereof. Additionally, an annealing process at elevated temperatures distributes the implanted ion specie. The N-type and P-type lightly doped drain regions 445, 450 are preferably doped, without limitation, to about $1 \times 10^{16}$ to $1 \times 10^{17}$ atoms/cm$^3$.

The semiconductor device also includes heavily doped regions (e.g., N-type heavily doped regions) 460 for the source and drain of the NMOS device that preferably have a different doping concentration profile than heavily doped regions (e.g., N-type heavily doped regions) 462 for the source and drain of the N-LDMOS device. The N-type heavily doped regions 460 for the NMOS device are formed within the P-type well 430 thereof and form the source and the drain for the NMOS device. Additionally, the N-type heavily doped regions 462 for the N-LDMOS device are formed within the P-type well 430 thereof and form a portion of the source and the drain for the N-LDMOS device.

The N-type heavily doped regions 460, 462 may be advantageously formed with an ion implantation process using dopant specie such as arsenic or phosphorus. The doping process includes a photoresist mask to define lateral dimensions of the N-type heavily doped regions 460, 462 and an annealing process at elevated temperature to properly distribute the implanted species. The N-type heavily doped region 460 for the source and drain of the NMOS device is doped, without limitation, to be greater than about $1 \times 10^{19}$ atoms/cm$^3$. The N-type heavily doped region 462 for the source and drain of the N-LDMOS device is doped, without limitation, to be greater than about $5 \times 10^{19}$ atoms/cm$^3$.

The semiconductor device also includes heavily doped regions (e.g., P-type heavily doped regions) 465 for the source and drain of the PMOS device that preferably have a different doping concentration profile than heavily doped regions (e.g., P-type heavily doped regions) 467 for the source and drain of the P-LDMOS device. The P-type heavily doped regions 465 for the PMOS device are formed within the N-type well 425 thereof and form the source and the drain for the PMOS device. Additionally, the P-type heavily doped regions 467 for the P-LDMOS device are formed within the N-type well 425 or in regions adjacent the N-type well 425 thereof and form a portion of the source and the drain for the P-LDMOS device.

The P-type heavily doped regions 465, 467 may be advantageously formed with an ion implantation process using dopant specie such as boron. The doping process includes a photoresist mask to define lateral dimensions of the P-type heavily doped regions 465, 467 and an annealing process at elevated temperature to properly distribute the implanted species. The P-type heavily doped region 465 for the source and drain of the PMOS device is doped, without limitation, to be greater than about $1 \times 10^{19}$ atoms/cm$^3$. The P-type heavily doped region 467 for the source and drain of the P-LDMOS device is doped, without limitation, to be greater than about $5 \times 10^{19}$ atoms/cm$^3$.

In the illustrated embodiment, the N-type well 425 above the N-type buried layer 420 does not cover the entire area that accommodates the P-LDMOS device in the substrate 415 between the shallow trench isolation regions 410 thereof. In particular, the N-type well 425 is located under and within a channel region 470, and the N-type well 425 and N-type buried layer 420 are oppositely doped in comparison to the P-type lightly and heavily doped regions 450, 467. Thus, doped regions (e.g., a P-type doped regions; also generally referred to as a "doped region and another doped region") 472, 474 extend between the P-type heavily doped regions 467 and the N-type well 425 of the P-LDMOS device and have a doping concentration profile less than a doping concentration profile of the P-type heavily doped regions 467. While the P-type heavily doped regions 467 preferably have the same doping concentration profiles, it is well within the broad scope of the present invention that the P-type heavily doped region 467 for the source has a different doping concentration-profile than the counterpart of the drain. The same principle applies to other like regions of the devices of the semiconductor device.

In the illustrated embodiment, the P-type doped regions 472, 474 happen to be embodied in the substrate 415 which has a doping concentration profile between $1 \times 10^{14}$ and $1 \times 10^{16}$ atoms/cm$^3$. Employing the substrate 415 as the P-type doped regions 472, 474 provides an opportunity to omit a masking and a processing step in the manufacture of the semiconductor device. In yet another alternative embodiment, the P-type doped regions 472, 474 may be formed by an ion implantation process prior to implanting the P-type heavily doped regions 467 for the source and the drain of the P-LDMOS device. Of course, the P-type doped regions 472, 474 may be formed with any doping concentration profile less than the P-type heavily doped regions 467.

Incorporating the P-type doped regions 472, 474 into the P-LDMOS device further increases a breakdown voltage between the P-type heavily doped regions 467 and the N-type well 425 of the P-LDMOS device. The P-LDMOS device, therefore, exhibits a higher drain-to-source voltage handing capability due to the higher breakdown voltage thereof and provides a higher source-to-gate voltage handling capability when the source is more positive than the gate 440. It should be understood that while the doped regions have been described with respect to the P-LDMOS device, the principles are equally applicable to the N-LDMOS device and, for that matter, other transistors of analogous construction.

Additionally, the P-LDMOS and N-LDMOS devices illustrated and described with respect to FIG. 4 are referred to as symmetrical devices. In other words, the symmetrical nature of the source and drain of the semiconductor device of FIG. 4 provide for a symmetrical device. Of course, those skilled in the art should understand that the dimensions of the source and drain (including the lightly and heavily dope regions thereof) may vary and still fall within the broad scope of the present invention. The semiconductor device also includes metal contacts 485 defined by dielectric regions 480 formed over salicide layers (one of which is designated 475) for the gate, source and drain of the PMOS, NMOS, P-LDMOS and N-LDMOS devices.

The development of a semiconductor device as described herein retains the fine line structures and accommodates an operation at higher voltages and with higher switching frequencies (e.g., five megahertz). By introducing a doped region(s) between the heavily doped region and oppositely doped well, the LDMOS device exhibits a high voltage handling capability from the drain to the source thereof (e.g., ten volts). At the same time, the higher voltage device is consiructed employing a limited number of additional processing steps. Moreover, the LDMOS device may exhibit a low level gate-to-source voltage limit (e.g., 2.5 volts) and at the same time handle drain-to-source voltages above the gate-to-source voltage limit thereof. Alternatively, the LDMOS device may exhibit a higher level source-to-gate voltage handling capability (e.g., five volts) when the source is more positive than the gate and at the same time handle drain-to-source voltages above the low level gate-to-source voltage limit thereof. In other words, the LDMOS device can switch the larger currents normally associated with a power train of a power convefler by appropriately designing selected regions thereof as set forth above. For a better understanding of the semiconductor device illustrated and described with respect to FIG. 4, sec U.S. Patent Application Publication No. 2005/0167756, entitled "Laterally Diffused Metal Oxide Semiconductor Device and Method of Forming the Same," to Lotfi, et al., which is incorporated herein by reference.

Figure 5A:
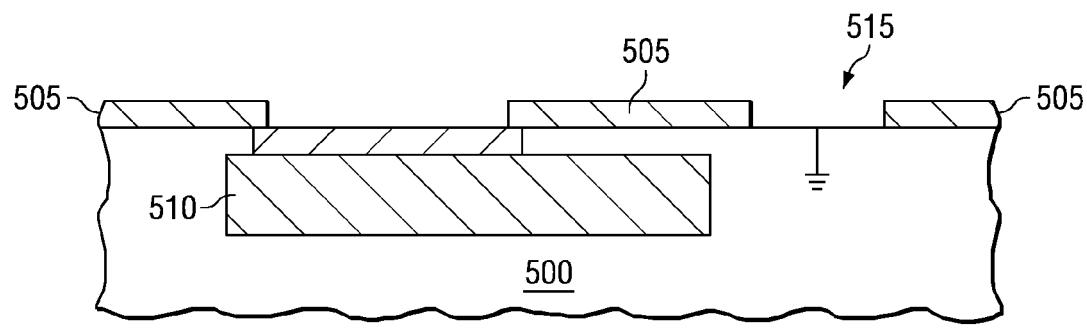
FIGS. 5A to 5H illustrate cross sectional views of an embodiment of constructing a micromagnetic device employable in an integrated circuit constructed according to the principles of the present invention.

Turning now to FIGS. 5A to 5H, illustrated are cross sectional views of an embodiment of constructing a micromagnetic device employable in an integrated circuit constructed according to the principles of the present invention. According to one embodiment, a planar inductor, optionally a double-spiral planar inductor, is formed as an example of a micromagnetic device. As illustrated in FIG. 5A, a semiconductor substrate (also referred to as a "substrate") 500 is provided with a passivation or substrate insulation layer 505 formed thereon, typically an oxide having a thickness of about two micrometers. Additionally, a semiconductor device 510 (such as the semiconductor device illustrated and described with respect to FIG. 4) is formed within the substrate 500. Additionally, a plurality of vias (one of which is designated 515) are formed within the substrate insulation layer 505 to provide electrical connectivity between the semiconductor device 510 and the micromagnetic device, and to provide a ground connection for the magnetic cores thereof. Of course, in keeping with the spirit of the present invention, the integrated circuit employing the micromagnetic device may include a controller, driver and power train embodied in, or portions thereof, the integrated circuit.

Figure 5B:
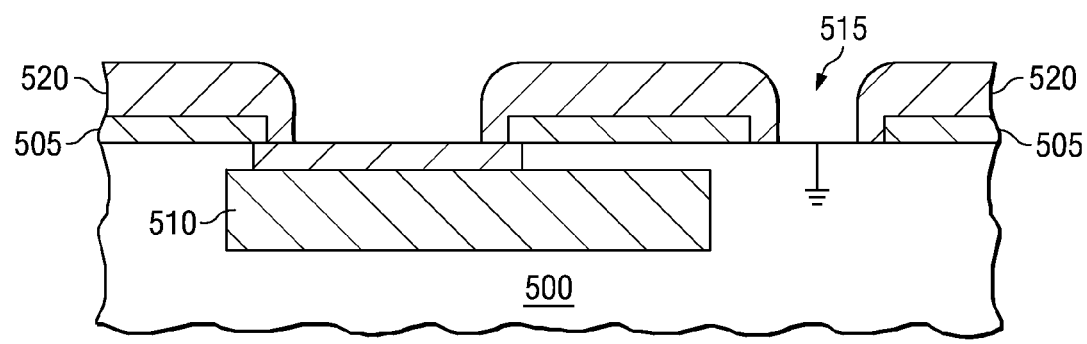

Turning now to FIG. 5B, an insulation and planarization layer is embodied in a first photoresist layer 520 formed over the substrate insulation layer 505 and the substrate 500. Typically, the first photoresist layer 520 is patterned to maintain the integrity of the vias 515. Advantageously, the first photoresist layer 520 is a Novolac-type positive photoresist layer sensitive to ultraviolet light such as a AZ-4000 series sold by AZ Electronic Materials, a division of Clariant Corporation of Charlotte, N.C. The first photoresist layer 520 is substantially inert to aggressive chemical environments such as electroplating solutions. Good adhesion to a variety of metals is also desirable, since metal seed layers for electroplating are often formed on the first photoresist layer 520.

In addition, when it is desirable to incorporate the first photoresist layer 520 as an insulation and planarization layer, the first photoresist layer 520 advantageously exhibits desirable mechanical and electrical properties. More specifically, in multilayer components, the first photoresist layer 520 advantageously has the ability to provide a planar surface for subsequent lithography and layer formation. Also, the desirable electrical properties include an acceptable dielectric constant when cured. Depending on the desired thickness of the first photoresist layer 520, it is possible that the first photoresist layer 520 constitutes several thin layers. Patterning of the first photoresist layer 520 is performed according to conventional techniques. Curing is used to render the first photoresist layer 520 substantially inert to subsequent environments such as electroplating solutions.

Figure 5C:
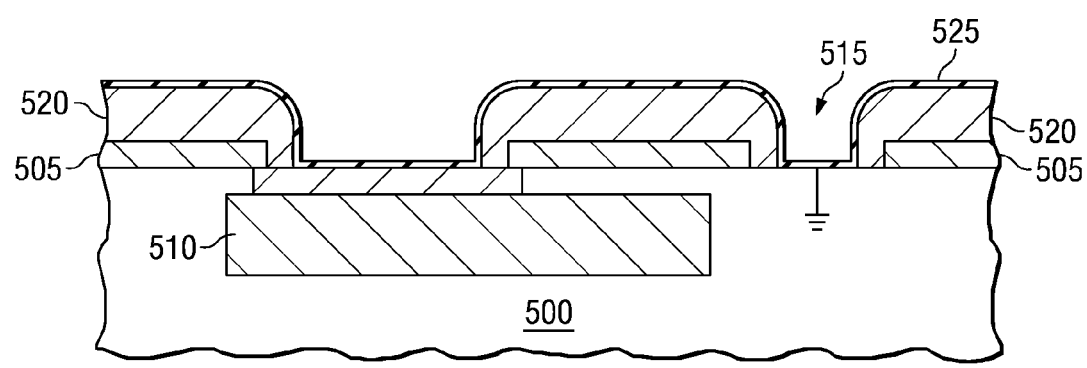

Turning now to FIG. 5C, after the first photoresist layer 520 is patterned, a first metallic seed layer 525 is formed to act as a seed layer for subsequent electroplating of a lower magnetic core of the micromagnetic device. An exemplary material for the first metallic seed layer 525 is a two layer titanium/gold film, e.g., about 125 to 300 angstroms of titanium followed by 500 to 3000 angstroms of gold. The gold exhibits desirable resistivity and chemical properties, and the titanium enhances adhesion of the gold to the cured first photoresist layer 520. The gold and titanium are typically deposited by sputtering or electron beam deposition. It is also possible to use a titanium/copper film as the first metallic seed layer 525.

Figure 5D:
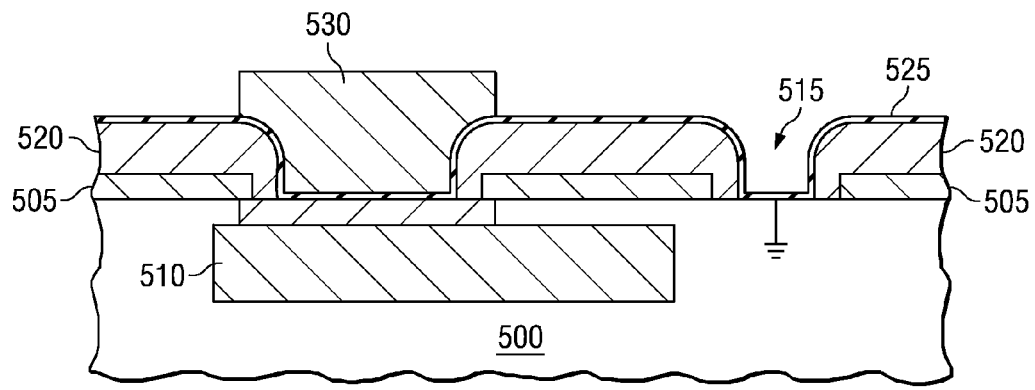

Turning now to FIG. 5D, a patterned photoresist layer 530 is formed and patterned for subsequent formation of the lower magnetic core. The thickness of the patterned photoresist layer 530 is based on the desired thickness of the magnetic core, i.e., the magnetic material is generally electroplated up to the top surface of the patterned photoresist layer 530.

Figure 5E:
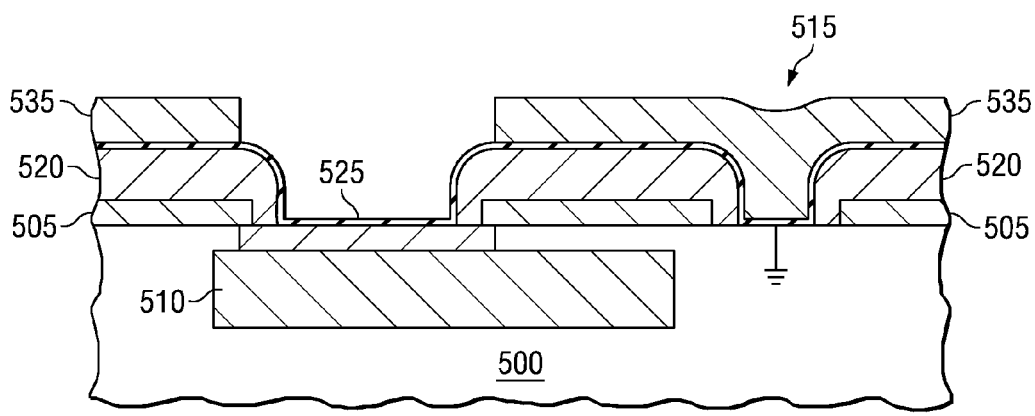

Turning now to FIG. 5E, after formation of the patterned photoresist layer 530, a lower magnetic core 535 is formed by electroplating on to the first metallic seed layer 525, and the patterned photoresist layer 530 is then removed. The lower magnetic core 535 is formed from any suitable magnetic material, typically a soft magnetic material for an inductor and transformer applications (e.g., Permalloy). Advantageously, the lower magnetic core 535 is formed from a iron alloy. The properties of a desirable magnetic core material include relatively low coercivity, relatively high electrical resistivity, and relatively high saturation magnetization.

Figure 5F:
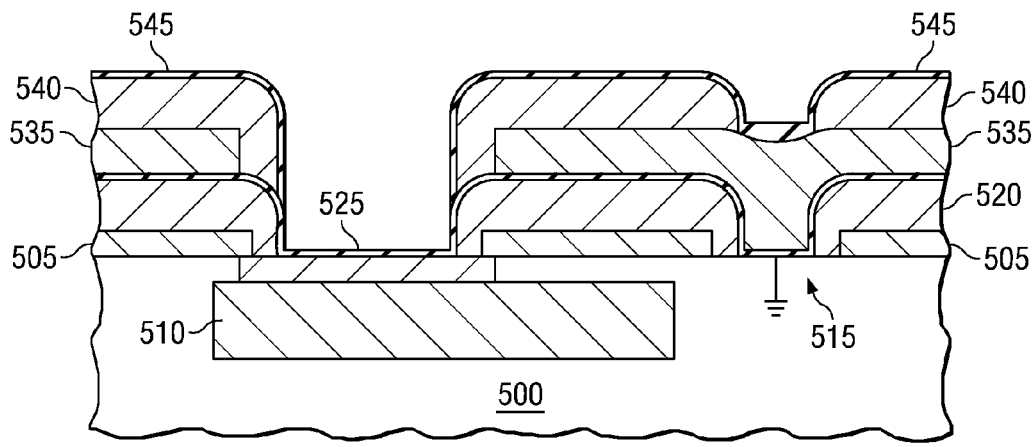

Turning now to FIG. 5F, a second photoresist layer 540 is formed as another insulation and planarization layer and is patterned to retain the integrity of the vias 515. Thereafter, a second metallic seed layer 545, typically of the same material and properties as described above, is formed on the second photoresist layer 540. In particular, the second metallic seed layer 545 is patterned in a manner that avoids creation of a short circuit between spirals of the to-be-formed conductive coil or winding. Alternatively, portions of the first and second metallic seed layers 525, 545 that may create such short circuits may be removed during a later step.

Figure 5G:
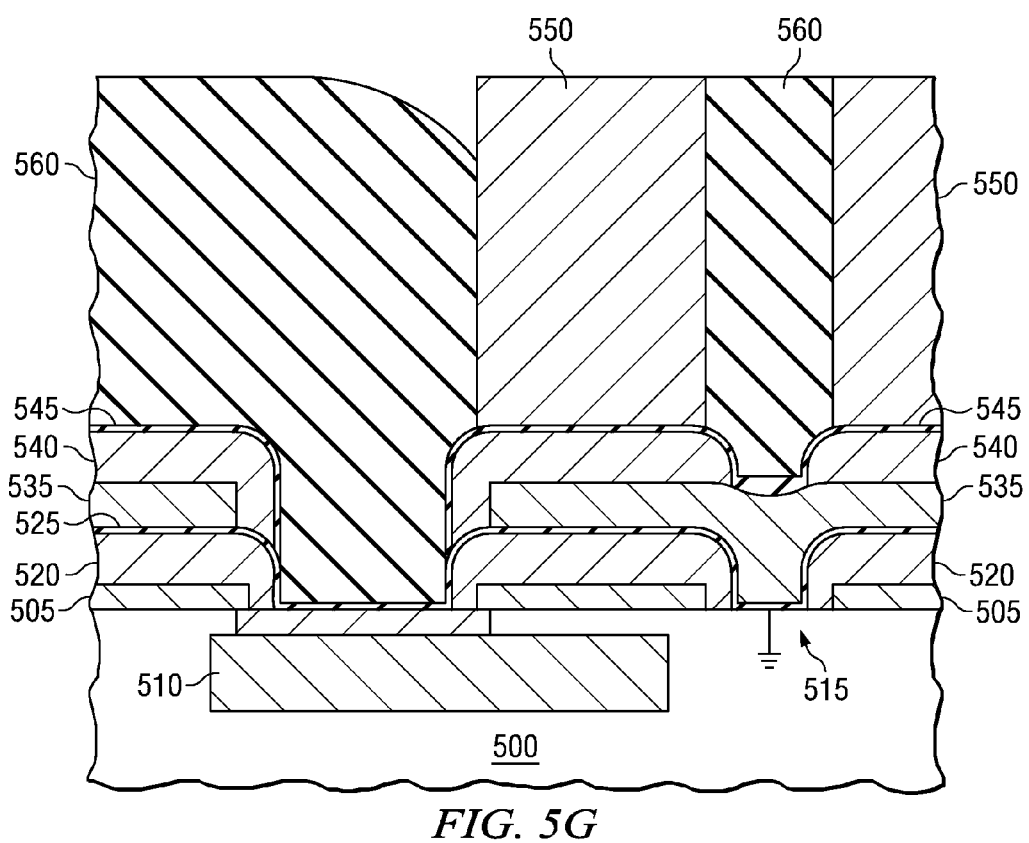

Turning now to FIG. 5G, a third photoresist layer 550 is formed to provide a mold for formation of a conductive coil 560, which is typically a copper coil. The conductive coil 560 is formed by electroplating on to the second metallic seed layer 545. A thickness of the conductive coil 560 and the third photoresist layer 550 is typically about 30 micrometers. The third photoresist layer 550 is not removed, but instead remains to act as an electrical insulator and a planar, mechanical support layer within the micromagnetic device.

Figure 5H:
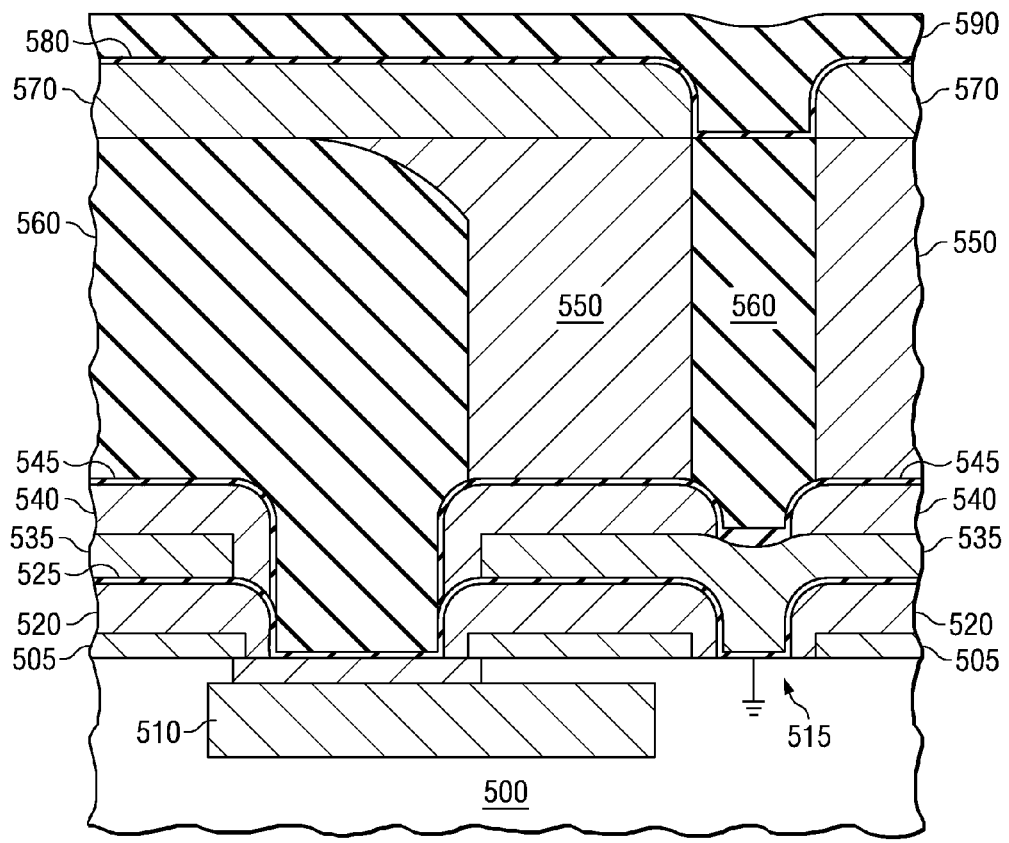

Turning now to FIG. 5H, a fourth photoresist layer 570 is formed to provide an another insulation and planarization layer. It should be understood that it is possible to cure both the third and fourth photoresist layers 550, 570 at the same time. A third metallic seed layer 580 is formed for electroplating and formed from materials analogous to the first metallic seed layer 525 described above. Another patterned photoresist layer (not shown) is then formed to provide a mold for the subsequent electroplating of an upper magnetic core 590 and having a thickness selected to provide the upper magnetic core 590 of substantially the same thickness. Finally, the upper magnetic core 590 is electroplated with a material and technique as described above with respect to the lower magnetic core 535. The another photoresist layer is then removed. Optionally, an additional insulation layer may be formed over the upper magnetic core 590 for protection purposes.

Figure 6:
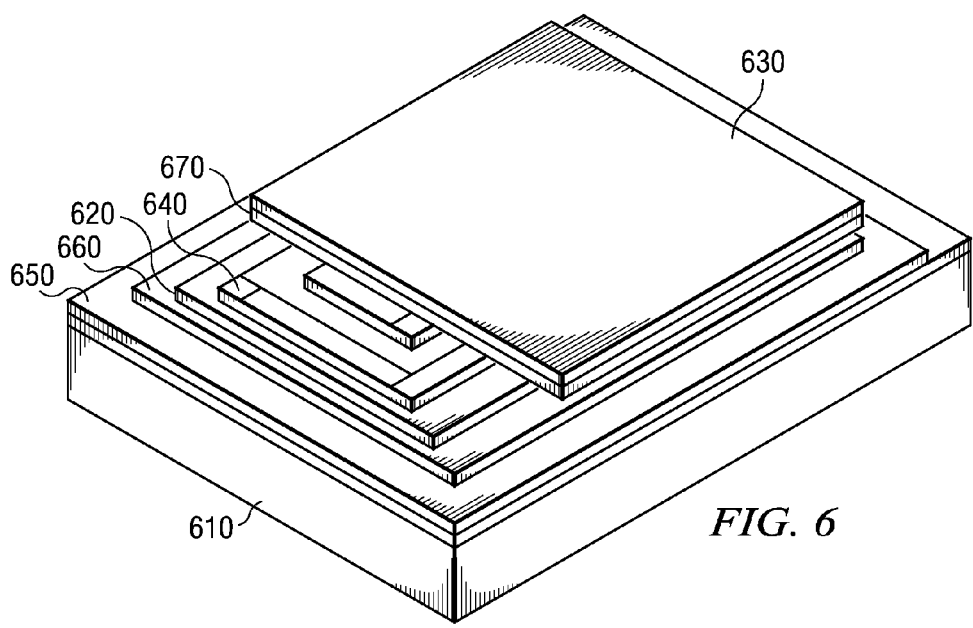
FIG. 6 illustrates an isometric view of an embodiment of a micromagnetic device employable in an integrated circuit constructed according to the principles of the present invention.

Turning now to FIG. 6, illustrated is an isometric view of an embodiment of a micromagnetic device employable in an integrated circuit constructed according to the principles of the present invention. The micromagnetic device is formed on a semiconductor substrate (also referred to as a "substrate") 610 with lower and upper magnetic cores 620, 630, a spiral conductive coil 640 (a single spiral is shown), along with intermediate cured photoresist layers 650, 660, 670. In one embodiment, the lower and upper magnetic cores 620, 630 are formed from an iron-cobalt-phosphorus alloy, and are about five micrometers thick. The spiral conductive coil or winding 640 is formed from copper in a thickness of about 30 micrometers and the photoresist layers 650, 660, 670 are formed from one or more AZP-4000 series photoresist layers as mentioned above.

Numerous variations of this particular embodiment are possible including performance of the steps above in different order and with additional or alternative layers, and should be apparent to those skilled in the art. Additionally, for a more detailed analysis of the micromagnetic device as described herein, see U.S. Pat. No. 6,495,019 entitled "Device Comprising Micromagnetic Components for Power Applications and Process for Forming Device," to Filas, et al., issued Dec. 17, 2002 and "Issues and Advances in High-Frequency Magnetics for Switching Power Supplies," by Lotfi, et al., Proceedings of the IEEE, Vol. 89, No. 6, pp. 833-845, June 2001, both of which are incorporated herein by reference.

Figure 7:
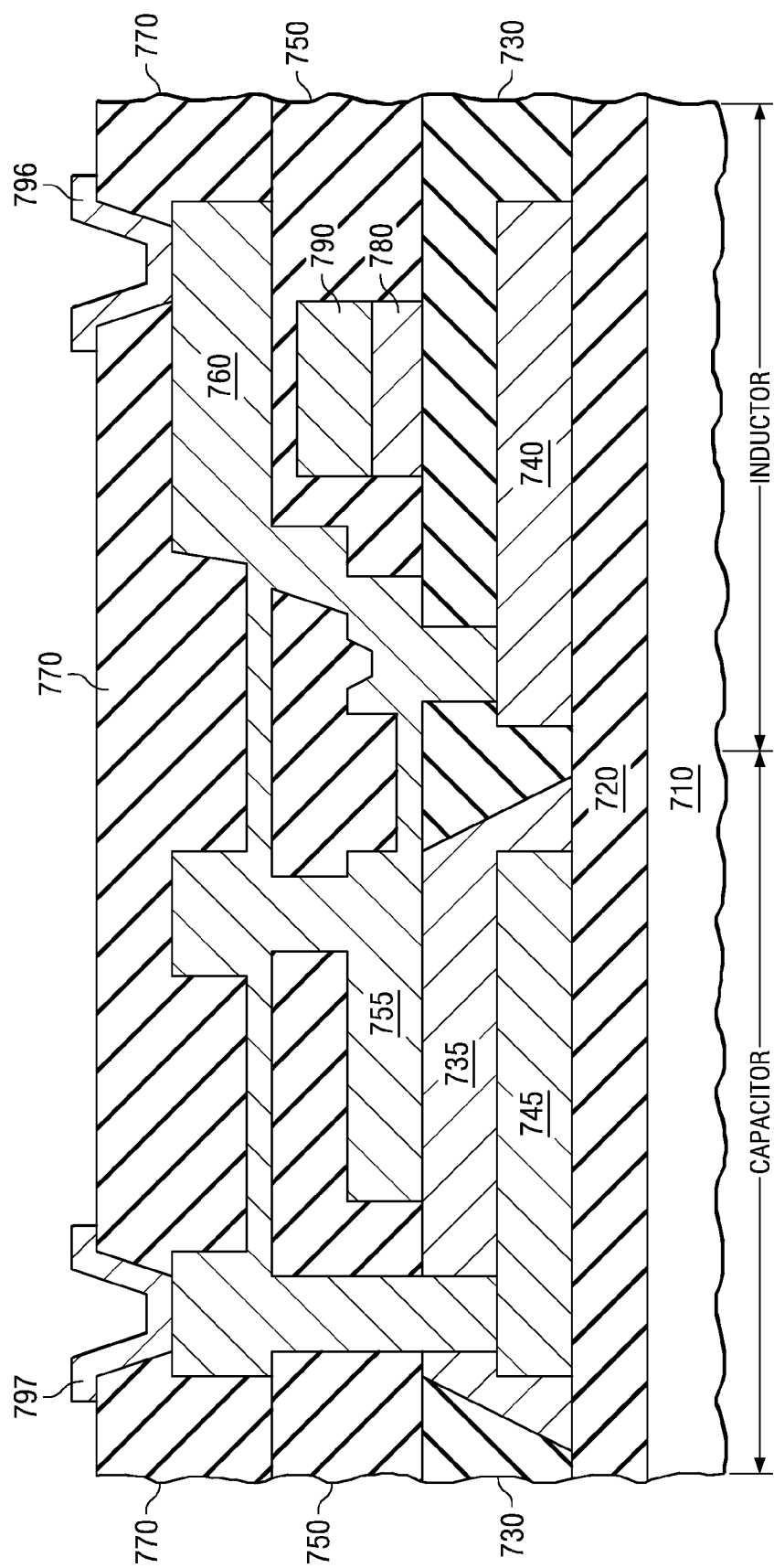
FIG. 7 illustrates a cross sectional view of an embodiment of an output filter employable in an integrated circuit constructed according to the principles of the present invention.

Turning now to FIG. 7, illustrated is a cross sectional view of an embodiment of an output filter employable in an integrated circuit constructed according to the principles of the present invention. In the illustrated embodiment, the output filter includes a capacitor coupled to an inductor embodied in a micromagnetic device. The output filter is constructed on a semiconductor substrate (also referred to as a "substrate," and composed of, for instance, silicon, glass, ceramic or the like) 710 having a passivation layer (e.g., silicon dioxide) 720 formed thereon using conventional formation processes such as a thermal growing process.

The micromagnetic device includes a first and second conductive winding layer (composed of, for instance, aluminum or any other conductive material) 740, 760 surrounded by first, second and third insulative layers or insulators 730, 750, 770. The micromagnetic device also includes a metallic layer 780 that provides an adequate bond between a ferromagnetic core 790 and the insulators 730, 750, 770 coupled to the substrate 710 to facilitate the fabrication of the thereof. The micromagnetic device still further includes a plurality of inner-layer vias that provide multiple paths between layers of the micromagnetic device and a terminal 796 for connection to another device.

The capacitor includes first and second capacitor plates 745, 755 and a dielectric layer 735 located between the first and second capacitor plates 745, 755. The capacitor and micromagnetic device are electrically coupled as illustrated by the conductive layers running therebetween. The capacitor also includes a plurality of inner-layer vias that provide multiple paths between the first and second plates 745, 755 of the capacitor and a terminal 797 for connection to another device. An embodiment of a micromagnetic device is disclosed in U.S. Pat. No. 6,118,351 entitled "Micromagnetic Device for Power Processing Applications and Method of Manufacture Therefor," to Kossives, et al., issued Sep. 12, 2000, and several embodiments of filter circuits are disclosed in U.S. Pat. No. 6,255,714 entitled "Integrated Circuit Having a Micromagnetic Device Including a Ferromagnetic Core and Method of Manufacture Therefor," to Kossives, et al., issued Jul. 3, 2001, both of which are incorporated by reference.

Thus, a power converter embodied, or portions thereof, in an integrated circuit and related methods of constructing the same with readily attainable and quantifiable advantages has been introduced. Those skilled in the art should understand that the previously described embodiments of the integrated circuit including the power converter and portions thereof embodied in the integrated circuit and related methods of constructing the same are submitted for illustrative purposes only. In addition, other embodiments capable of producing an integrated circuit employable with higher voltage devices and low voltage devices integrable within a semiconductor device are well within the broad scope of the present invention. While the integrated circuit has been described in the environment of a power converter, the integrated circuit may also apply to other systems such as a power amplifier, motor controller, and a system to control an actuator in accordance with a stepper motor or other electromechanical device.

For a better understanding of integrated circuits, semiconductor devices and methods of manufacture therefor see "Semiconductor Device Fundamentals," by R. F. Pierret, Addison-Wesley (1996); "Handbook of Sputter Deposition Technology," by K. Wasa and S. Hayakawa, Noyes Publications (1992); "Thin Film Technology," by R. W. Berry, P. M. Hall and M. T. Harris, Van Nostrand (1968); "Thin Film Processes," by J. Vossen and W. Kern, Academic (1978); and "Handbook of Thin Film Technology," by L. Maissel and R. Glang, McGraw Hill (1970). For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit formed on a semiconductor substrate, comprising:
   a switch formed on said semiconductor substrate; and
   a driver switch of a driver configured to provide a drive signal to said switch and embodied in a transistor, including:
      a gate located over a channel region recessed into a semiconductor substrate,
      a source/drain including a lightly doped region located adjacent said channel region and a heavily doped region located adjacent said lightly doped region,
      an oppositely doped well with respect to said lightly and heavily doped regions located under and within said channel region, and
      a doped region of like type to said heavily doped region and adjoining said heavily doped region and said oppositely doped well, said doped region having a doping concentration profile less than a doping concentration profile of said heavily doped region.

2. The integrated circuit as recited in claim 1 wherein said switch is a transistor, including:
   a gate located over a channel region recessed into said semiconductor substrate,
   a source/drain including a lightly doped region located adjacent said channel region and a heavily doped region located adjacent said lightly doped region, and
   an oppositely doped well with respect to said lightly and heavily doped regions of said switch located under and within said channel region.

3. The integrated circuit as recited in claim 2 wherein said transistor employable as said switch further includes a doped region, located between said heavily doped region and said oppositely doped well, having a doping concentration profile less than a doping concentration profile of said heavily doped region.

4. The integrated circuit as recited in claim 1 wherein said transistor, further includes:
   another source/drain including a lightly doped region located adjacent said channel region and a heavily doped region located adjacent said lightly doped region; and
   another doped region, located between said heavily doped region of said another source/drain and said oppositely doped well, having a doping concentration profile less than a doping concentration profile of said heavily doped region of said another source/drain.

5. The integrated circuit as recited in claim 1 wherein said transistor further includes a gate dielectric layer underlying said gate and gate sidewall spacers about said gate.

6. The integrated circuit as recited in claim 1 wherein said transistor further includes metal contacts formed over a salicide layer on said gate and said source/drain.

7. The integrated circuit as recited in claim 1 wherein said transistor is a laterally diffused metal oxide semiconductor device.

8. The integrated circuit as recited in claim 1 wherein an oppositely doped buried layer is located under said doped region.

9. The integrated circuit as recited in claim 1 further comprising a shallow trench isolation region located adjacent said heavily doped region opposite said lightly doped region within said semiconductor substrate.

10. The integrated circuit as recited in claim 1 further comprising a complementary metal oxide semiconductor device, formed on said semiconductor substrate, that includes a source/drain having a heavily doped region with a doping concentration profile different from said doping concentration profile of said heavily doped region of said source/drain of said transistor.

11. An integrated circuit formed on a semiconductor substrate, comprising:
    a switch formed on a semiconductor substrate;
    a driver switch of a driver configured to provide a drive signal to said switch and embodied in a laterally diffused metal oxide semiconductor device, including:

a gate located over a channel region recessed into a semiconductor substrate, a source/drain including a lightly doped region located adjacent said channel region and a heavily doped region located adjacent said lightly doped region, an oppositely doped well with respect to said lightly and heavily doped regions located under and within said channel region, and a doped region of like type to said heavily doped region and adjoining said heavily doped region and said oppositely doped well, said doped region having a doping concentration profile less than a doping concentration profile of said heavily doped region; and a complementary metal oxide semiconductor device formed on said semiconductor substrate.

12. The integrated circuit as recited in claim 11 wherein said switch is referenced to a voltage level different from said driver switch and said switch is a transistor, including:

a gate located over a channel region recessed into said semiconductor substrate, a source/drain including a lightly doped region located adjacent said channel region and a heavily doped region located adjacent said lightly doped region, and an oppositely doped well with respect to said lightly and heavily doped regions of said switch located under and within said channel region.

13. The integrated circuit as recited in claim 12 wherein said transistor employable as said switch further includes a doped region, located between said heavily doped region and said oppositely doped well, having a doping concentration profile less than a doping concentration profile of said heavily doped region.

14. The integrated circuit as recited in claim 11 wherein said laterally diffused metal oxide semiconductor device, further includes:

another source/drain including a lightly doped region located adjacent said channel region and a heavily doped region located adjacent said lightly doped region; and another doped region, located between said heavily doped region of said another source/drain and said oppositely doped well, having a doping concentration profile less than a doping concentration profile of said heavily doped region of said another source/drain.

15. The integrated circuit as recited in claim 11 wherein said laterally diffused metal oxide semiconductor device further includes a gate dielectric layer underlying said gate and gate sidewall spacers about said gate.

16. The integrated circuit as recited in claim 11 wherein said laterally diffused metal oxide semiconductor device further includes metal contacts formed over a salicide layer on said gate and said source/drain.

17. The integrated circuit as recited in claim 11 wherein said laterally diffused metal oxide semiconductor device is a P-type laterally diffused metal oxide semiconductor device.

18. The integrated circuit as recited in claim 11 wherein an oppositely doped buried layer is located under said doped region.

19. The integrated circuit as recited in claim 11 further comprising a shallow trench isolation region located adjacent said heavily doped region opposite said lightly doped region within said semiconductor substrate.

20. The integrated circuit as recited in claim 11 wherein said complementary metal oxide semiconductor device includes a source/drain having a heavily doped region with a doping concentration profile different from said doping concentration profile of said heavily doped region of said source/drain of said transistor.

21. The integrated circuit as recited in claim 1 wherein said heavily doped region is adjacent to but not surrounded by said lightly doped region.

22. The integrated circuit as recited in claim 11 wherein said heavily doped region is adjacent to but not surrounded by said lightly doped region.

* * * * *

UNITED STATES PATENT AND TRADEMARK OFFICE
CERTIFICATE OF CORRECTION

PATENT NO. : 7,335,948 B2
APPLICATION NO. : 10/924088
DATED : February 26, 2008
INVENTOR(S) : Lotfi et al.

It is certified that error appears in the above-identified patent and that said Letters Patent is hereby corrected as shown below:

On the Title Page, item (56) References Cited, U.S. PATENT DOCUMENTS, Page 1, 1st Column, between the 5th and 6th entries, insert --5,156,989 A   10/1992   Williams et al.--.
On the Title Page, item (56) References Cited, U.S. PATENT DOCUMENTS, Page 1, 2nd Column, 2nd entry, delete "5,833,585 A   11/1998   Jones et al.".
On the Title Page, item (56) References Cited, U.S. PATENT DOCUMENTS, Page 2, 1st Column, 2nd entry, delete "6,166,989 A   12/2000   Hamamoto et al.".
On the Title Page, item (56) References Cited, U.S. PATENT DOCUMENTS, Page 2, 1st Column, 19th entry, delete "Nemati et al." and insert --Cho et al.--.
On the Title Page, item (56) References Cited, U.S. PATENT DOCUMENTS, Page 2, 1st Column, 20th entry, delete "6,688,985 B2   2/2004   Weiss et al.".
On the Title Page, item (56) References Cited, U.S. PATENT DOCUMENTS, Page 2, 1st Column, between the 22nd and 23rd entries, insert --6,833,585 B2   12/2004   Kim et al.--.
On the Title Page, item (56) References Cited, U.S. PATENT DOCUMENTS, Page 2, 2nd Column, 6th entry, delete "8/2004" and insert --8/2005--.
On the Title Page, item (56) References Cited, U.S. PATENT DOCUMENTS, Page 2, 2nd Column, 10th entry, delete "2005/0179094" and insert --2005/0179084--.
On the Title Page, item (56) References Cited, U.S. PATENT DOCUMENTS, Page 2, 2nd Column, 11th entry, delete "2005/0188203" and insert --2005/0168203--.
In Col. 1, line 65, after such insert --as--.
In Col. 2, line 53, delete "handing" and insert --handling--.
In Col. 6, line 58, delete "complemtary" and insert --complementary--.
In Col. 6, line 66, delete "at" and insert --al.--.
In Col. 7, line 2, delete "at" and insert --al.--.
In Col. 13, line 48, delete "is".
In Col. 15, line 50, delete "gaze" and insert --gate--.
In Col. 15, line 59, delete "eight" and insert --eighth--.
In Col. 15, line 60, delete "QDR8" and insert --$Q_{DR8}$--
In Col. 16, line 2, delete "at" and insert --al.--.
In Col. 19, line 52, delete "dope" and insert --doped--.
In Col. 20, line 13, delete "sec" and insert --see--.
In Col. 22, line 50, delete "of the".

UNITED STATES PATENT AND TRADEMARK OFFICE
CERTIFICATE OF CORRECTION

PATENT NO. : 7,335,948 B2
APPLICATION NO. : 10/924088
DATED : February 26, 2008
INVENTOR(S) : Lotfi et al.

It is certified that error appears in the above-identified patent and that said Letters Patent is hereby corrected as shown below:

In Col. 24, line 29, delete "transistor," and insert --transistor--.
In Col. 25, line 34, delete "device," and insert --device--.

Signed and Sealed this

Seventeenth Day of February, 2009

JOHN DOLL
*Acting Director of the United States Patent and Trademark Office*